(12) United States Patent
Gough et al.

(10) Patent No.: US 12,165,720 B2
(45) Date of Patent: Dec. 10, 2024

(54) ENDURANCE AND SERVICEABILITY IN SOLID STATE DRIVES

(71) Applicant: Intel Corporation, Santa Clara, CA (US)

(72) Inventors: Corey Gough, Hillsboro, OR (US); Nityasrilalitha Gollamudi, Folsom, CA (US); Mihir Patel, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 864 days.

(21) Appl. No.: 17/033,043

(22) Filed: Sep. 25, 2020

(65) Prior Publication Data
US 2021/0012844 A1 Jan. 14, 2021

(51) Int. Cl.
*G11C 16/34* (2006.01)
*G06F 11/07* (2006.01)
*G06F 11/14* (2006.01)

(52) U.S. Cl.
CPC .......... *G11C 16/349* (2013.01); *G06F 11/073* (2013.01); *G06F 11/1456* (2013.01); *G11C 16/3431* (2013.01)

(58) Field of Classification Search
None
See application file for complete search history.

(56) References Cited

U.S. PATENT DOCUMENTS

| 10,248,333 | B1 | 4/2019 | Shah | |
| 10,761,740 | B1* | 9/2020 | Bradshaw | G06F 12/0246 |
| 2017/0147237 | A1* | 5/2017 | Fang | G06F 11/008 |
| 2019/0129614 | A1* | 5/2019 | Dalmatov | G06F 3/0689 |
| 2019/0303283 | A1 | 10/2019 | McLaughlin | |
| 2020/0026643 | A1 | 1/2020 | Tai | |
| 2020/0065007 | A1* | 2/2020 | Tai | G06F 3/0616 |
| 2020/0142589 | A1* | 5/2020 | Galbo | G06F 3/0616 |

OTHER PUBLICATIONS (Zhao et al.)—IEEE—Chameleon An Adaptive Wear Balancer for Flash Clusters—(May 2018) (Year: 2018).*
Extended European Search Report for European Patent Application No. 21192954.2, mailed Feb. 21, 2022, 10 pages.

* cited by examiner

*Primary Examiner* — Cynthia Britt
*Assistant Examiner* — Matthew W Wahlin
(74) *Attorney, Agent, or Firm* — Jordan IP Law, LLC

(57) ABSTRACT

Systems, apparatuses and methods may provide technology for intelligent drive wear management. The technology may include determining a difference between a wear value derived for a first solid state storage drive and a wear value derived for a second solid state storage drive, and if the difference in wear value exceeds a wear skew threshold, swapping content between the first drive and the second drive. The technology may also include sorting an array of solid state storage drives into a plurality of drive groups based on a wear value derived for each drive, and determining, for a first pair of drives in a drive group, a difference in wear value between the drives in the first pair. Respective pairs of drives in a drive group may be selected based on the drive wear value and a drive rotation counter value associated with each drive. The technology may further include determining an average wear value for each drive group based on the wear values of each drive in the drive group and providing for maintenance service for the drives in the drive group if the average wear value for the drive group exceeds a potential drive failure threshold.

25 Claims, 10 Drawing Sheets

202

| Drive No. | $D_1$ | $D_2$ | $D_3$ | $D_4$ | $D_5$ | $D_6$ | $D_7$ | $D_8$ | $D_9$ | $D_{10}$ | $D_{11}$ | $D_{12}$ | $D_{13}$ | $D_{14}$ | $D_{15}$ | $D_{16}$ |
|---|---|---|---|---|---|---|---|---|---|---|---|---|---|---|---|---|

| Drive No. | $D_1$ | $D_2$ | $D_3$ | $D_4$ | $D_5$ | $D_6$ | $D_7$ | $D_8$ | $D_9$ | $D_{10}$ | $D_{11}$ | $D_{12}$ | $D_{13}$ | $D_{14}$ | $D_{15}$ | $D_{16}$ |
|---|---|---|---|---|---|---|---|---|---|---|---|---|---|---|---|---|
| Content | A | B | C | D | E | F | G | H | I | J | K | L | M | N | O | P |
| Wear Value | 0.72 | 0.5 | 0.4 | 0.2 | 0.1 | 0.25 | 0 | 0 | 0.6 | 0.42 | 0.02 | 0.33 | 0.55 | 0.8 | 0.5 | 0.3 |

FIG. 2B

| | Group 1 (206a) | | | | Group 2 (206b) | | | | Group 3 (206c) | | | | Group 4 (206d) | | | |
|---|---|---|---|---|---|---|---|---|---|---|---|---|---|---|---|---|
| Drive No. | $D_7$ | $D_8$ | $D_{11}$ | $D_5$ | $D_4$ | $D_6$ | $D_{16}$ | $D_{12}$ | $D_3$ | $D_{10}$ | $D_2$ | $D_{15}$ | $D_{13}$ | $D_9$ | $D_1$ | $D_{14}$ |
| Content | G | H | K | E | D | F | P | L | C | J | B | O | M | I | A | N |
| Wear Value | 0 | 0 | 0.02 | 0.1 | 0.2 | 0.25 | 0.3 | 0.33 | 0.4 | 0.42 | 0.5 | 0.5 | 0.55 | 0.6 | 0.72 | 0.8 |

FIG. 2C

Group 2:

210 → 216

| Drive No. | $D_4$ | $D_6$ | $D_{16}$ | $D_{12}$ | | $D_4$ | $D_6$ | $D_{16}$ | $D_{12}$ |
|---|---|---|---|---|---|---|---|---|---|
| Content | D | F | P | L | ⇒ | L | F | P | D |
| Wear Value | 0.2 | 0.25 | 0.3 | 0.33 | | 0.2 | 0.25 | 0.3 | 0.33 |

FIG. 2D

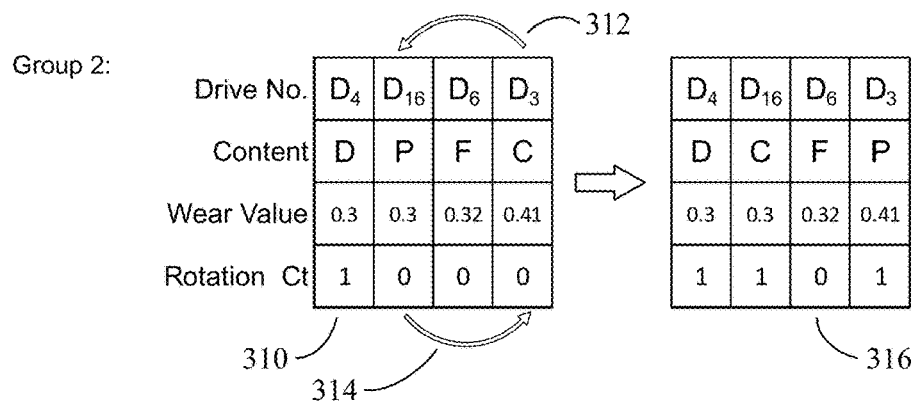
FIG. 3C
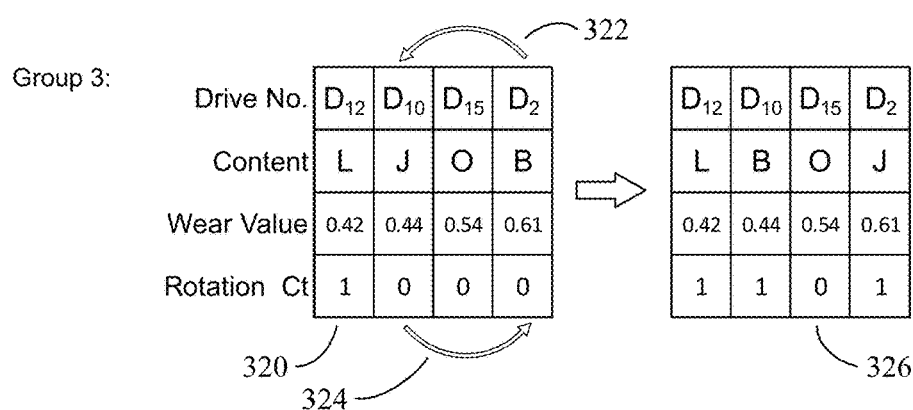
FIG. 3D
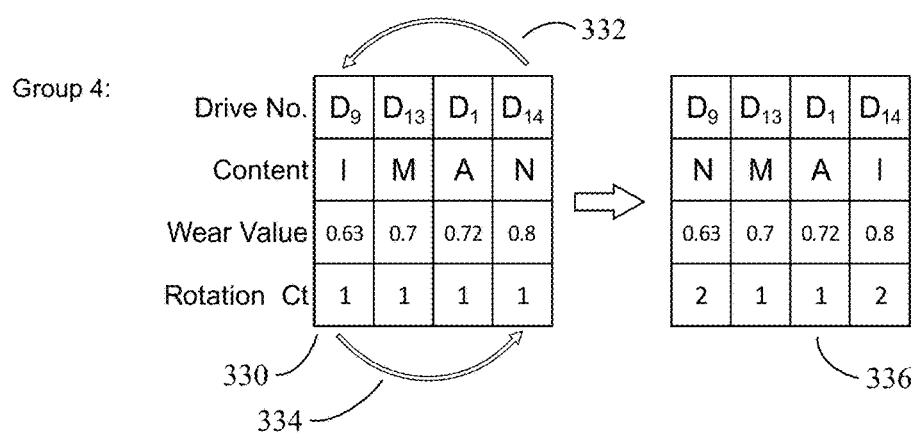
FIG. 3E
FIG. 3F

ENDURANCE AND SERVICEABILITY IN SOLID STATE DRIVES

TECHNICAL FIELD

Embodiments generally relate to computing systems. More particularly, embodiments relate to improving endurance and serviceability in solid state drives through intelligent drive wear management.

BACKGROUND

Many computing systems rely on storage devices utilizing solid state memory drives. Often, in such systems individual solid state drives (SSDs) will wear unevenly with respect to other solid state drives in the system, based on rate of writes (such as, e.g., NAND writes) for each drive. Such uneven wear of solid state drives negatively impacts availability of the storage subsystem, because the time from system deployment to first drive servicing is based on, not an average rate of NAND writes for all drives, but the rate of NAND writes for the most-written drive. Uneven wear of solid state drives also negatively impacts serviceability of the storage subsystem, because each drive is serviced individually as they fail. Such uneven wear is due to factors such as hotspots, where some drives receive a higher rate of NAND writes relative to other drives due to frequently referenced blocks, and tiering, where some drives are used as cache drives where they provide temporary storage for recently used data.

Current storage wear-leveling algorithms are designed to extend the lifetime of individual SSDs through even distribution of writes across the blocks of a drive. However, these solutions do not address input/output (I/O) write asymmetry between multiple drives of a storage subsystem. Based on actual content stored on the drives and relative access patterns of that content, some drives within a storage subsystem may have higher rates of NAND bytes written to them compared to other drives, with resulting skew in wear level among drives.

BRIEF DESCRIPTION OF THE DRAWINGS

The various advantages of the embodiments will become apparent to one skilled in the art by reading the following specification and appended claims, and by referencing the following drawings, in which:

FIGS. 2A-2F provide diagrams illustrating an example of drive wear management according to one or more embodiments;

FIGS. 3A-3F provide diagrams illustrating another example of drive wear management according to one or more embodiments;

DESCRIPTION OF EMBODIMENTS

Figure 1A:
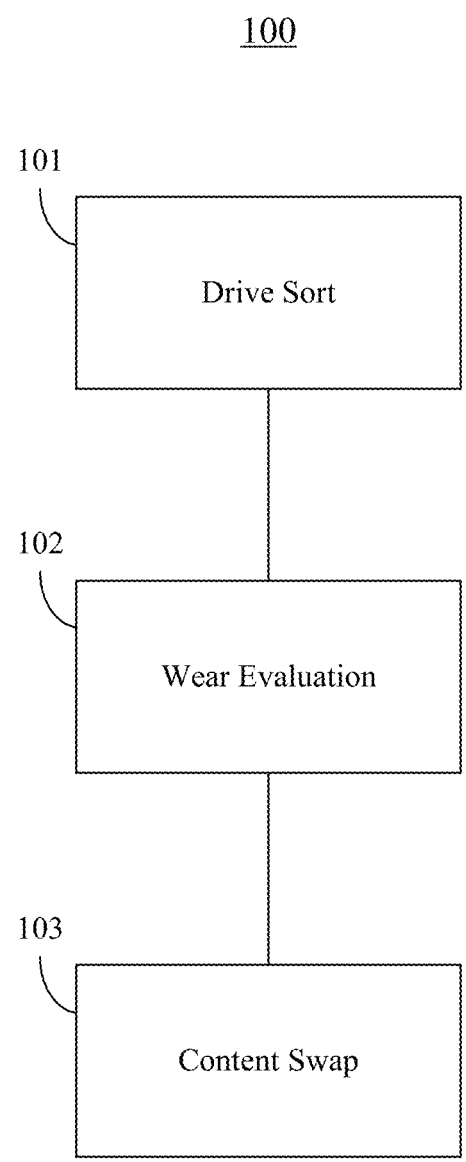
FIG. 1A provides a block diagram illustrating an example computing system for drive wear management according to one or more embodiments.

An improved computing system as described herein provides technology to monitor, track historical usage trends, and provide optimization recommendations to evenly wear storage devices independent of hotspots or tiering attributes. The technology may provide specific optimization actions for storage management to intelligently rotate drive contents (e.g., images, metadata, files, blocks, etc.) between heavily and lightly worn drives. Additionally, the technology may permit management of drives in groups, recommending actions in a manner that minimizes the number of predictable or scheduled maintenance events by servicing many near-failure drives during a single maintenance event. The technology may also provide for intelligent rotation of drive roles between cache and capacity tiers.

Accordingly, the technology described herein extends wear leveling to a storage array/subsystem level. To even out the level of wear across drives of a storage array, the technology may identify drives within a storage array with higher wear and rotate them with lesser worn drives. Thus, drives within a storage tier may be rotated periodically as a maintenance activity. More particularly, drive rotation may be implemented by quantifying the level of wear on drives, categorizing them on basis of the same and interchanging data between drives. This approach of rotating drives within a tier may be extended to rotating drives between the cache and capacity tiers of a storage subsystem.

This rotational effect may enhance the operational lifetime of a storage subsystem until most of the drives in the subsystem are near the end of their life by reducing the skew in wear level across drives. Additionally, categorization of drives provides for identifying groups of drives that have similar health and wear characteristics, enabling batch management of subsets of drives. In turn, this results in reduced cost of serviceability and reduced down-time for the system.

For the purpose of quantifying the amount of wear on a drive (e.g., a solid state drive), a wear value metric (referred to herein as WEAR_VALUE) may be defined. The WEAR_VALUE metric may be computed as a function of wear attributes and health statistics (collectively referred to herein as wear attributes) of a drive. Such wear attributes may be pre-existing or derived from pre-existing components. For example, the technology may derive some or all of the wear attributes for each drive from SMART (Self-monitoring, Analysis and Reporting Technology), a storage monitoring component (supported by Intel® and other solid state drive devices) that reports various attributes and statistics for the health of a drive. At a high level, data needed to predict endurance of a drive may include such wear attributes as the drive size, the number of program/erase cycles, the total host/NAND bytes written to the drive, the write amplification factor, the total number of failed blocks, the number of remaining reserve blocks, drive warranty end date and/or device temperature. This information may be periodically or constantly gathered, recorded and processed to identify historic trends in the characteristics of the drive, and may be maintained in a database over time. Such processed information may be used for computing or updating the WEAR_VALUE metric, which may also be maintained in a database over time.

As wear attributes are polled for every drive, whether previously existing or newly introduced, the WEAR_VALUE metric may be computed and, based on this value, the drive may be assigned a grade. The storage array may be segmented into subsets or groups of drives based on their grade or WEAR_VALUE. Each group of drives may have a common grade bucket (i.e., same or similar grades) indicating that each of the drives in the group are in a similar range of lifetime and wear. Grouping drives by grade or WEAR_VALUE provides an ability to conduct wear-leveling within grade buckets, enabling batch serviceability of a group or groups of drives rather than requiring service for individual drives. Furthermore, by grouping drives, wear leveling between drives may be contained to drives within a grade bucket, preventing unwanted effects such as, e.g., where a new drive with greater warranty life may be subjected to intensive wear due to rotation with an older drive closer to its warranty end date. Grouping drives into grade buckets therefore helps identify drives with similar wear attributes and wear them evenly.

Additionally, a rotation counter value (referred to herein as ROTATION_COUNTER) may be maintained for each drive in the array, reflecting the number of times that the drive has had contents swapped (rotated) with another drive. The ROTATION_COUNTER may be incremented for a drive every time the drive undergoes rotation (i.e., when swapping contents with another drive). Checking for the number of times a drive has been rotated may help ensure that a drive is not undergoing rotations too often, in comparison to other drives in the group.

The technology for drive wear management disclosed herein may apply to storage drives such as solid state drives. Such drives may include memory devices such as RAM, firmware, flash memory, etc. Such drives may be included in storage 22 as part of computing system 10 described herein with reference to FIG. 5, discussed below.

FIG. 1A provides a block diagram illustrating an example computing system 100 for drive wear management according to one or more embodiments, with reference to components and features described herein including but not limited to the figures and associated description. The system 100 may include a drive sort module 101, a wear evaluation module 102, and a content swap module 103. The system 100 may also include a processor (not shown) for executing one or more programs to carry out the functions of the drive sort module 101, the wear evaluation module 102, and/or the content swap module 103. The system 100 may further include, or be in data communication with, an array of solid state drives (not shown). Each of the drive sort module 101, the wear evaluation module 102, and/or the content swap module 103 may be performed by or under direction of an operating system, such as, e.g., an operating system running on computing system 100 or on computing system 10 (described herein with reference to FIG. 5). More particularly, each of the drive sort module 101, the wear evaluation module 102, and the content swap module 103 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

For example, computer program code to carry out operations performed by the drive sort module 101, the wear evaluation module 102, and/or the content swap module 103 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

The drive sort module 101 may determine, for each drive in the drive array, a wear value metric as an indicator of wear level for the drive. The wear value metric may be computed as a function of wear attributes of a drive and may represent the amount of wear on a drive. The drive sort module 101 may also sort or rank the drives based on their respective wear value metric. The drive sort module 101 may also divide (or group) the sorted or ranked drives into groups. The wear evaluation module 102 may evaluate wear in the drives by determining a difference in wear value between respective pairs of drives in a drive group. The difference in wear value may be evaluated against a wear skew threshold. Respective pairs of drives in a drive group may be selected based on the drive wear value and the drive rotation counter value. The rotation counter value may represent the number of times the drive has been rotated (content swapped) with another drive. The content swap module 103 may, for at least one of the respective pairs of drives having a difference in wear value exceeding the wear skew threshold, swap content between a first drive in the pair and a second drive in the pair. Swapping content between drives in the drive pair may include swapping all files between the first drive and the second drive or swapping only the hot files of the drive with greater wear for files of the lesser-worn drive.

Figure 1B:
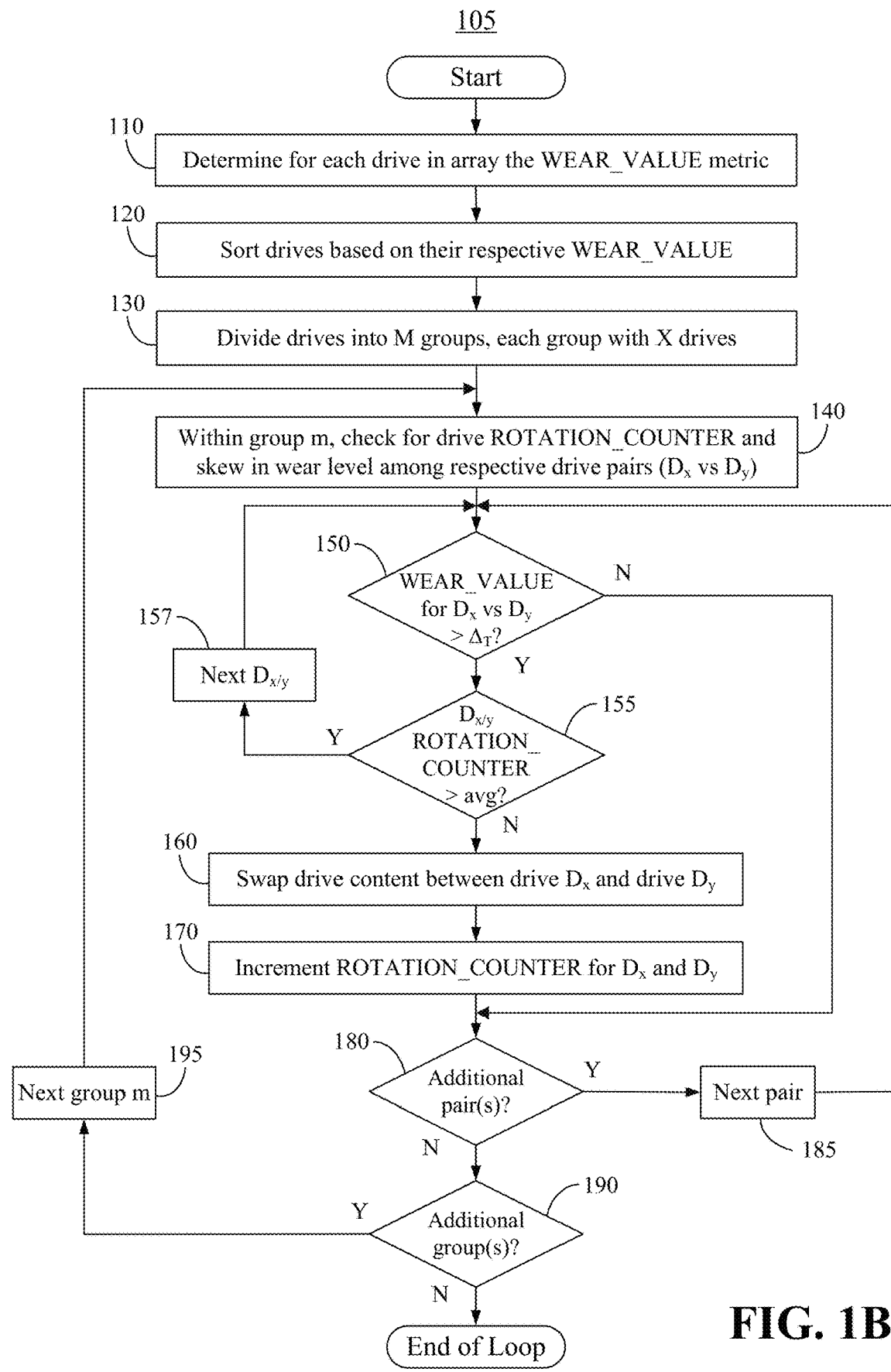
FIG. 1B provides a flow chart illustrating an example process flow for managing drive wear according to one or more embodiments.

FIG. 1B provides a flow chart illustrating an example process flow 105 for managing drive wear according to one or more embodiments, with reference to components and features described herein including but not limited to the figures and associated description. The process 105 provides drive wear optimization recommendations in the form of rotation of drive contents to evenly wear storage devices. The process 105 may be implemented in a computing system such as, e.g., computing system 100 (FIG. 1A, already discussed), or system 10 (described herein with reference to FIG. 5). The process 105 may be performed by or under direction of an operating system (e.g., an operating system running on computing system 100 or computing system 10). More particularly, the process 105 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

For example, computer program code to carry out operations shown in process 105 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

A computing system implementing process flow 105 for managing drive wear may include, or be in data communication with, an array of storage drives. The drives may be solid state drives (SSDs). The drive array may include a number of drives (N) for which it is desired to manage the drive wear.

Turning to FIG. 1B, illustrated processing block 110 provides for determining, for each drive in the drive array, the WEAR_VALUE metric as an indicator of wear level for the drive. As already discussed, the WEAR_VALUE metric may be computed as a function of wear attributes of a drive and may represent the amount of wear on a drive. The WEAR_VALUE metric may range from a minimum value to a maximum value. For example, in some embodiments, the range for the WEAR_VALUE metric may be 0 to 1, with 0 indicating a new healthy drive and 1 indicating that the drive needs to be replaced.

Illustrated processing block 120 provides for sorting (or ranking) the drives based on their respective WEAR_VALUE. In some embodiments, drives may be sorted or ranked based on the grade assigned to the drive (where the grade is based on WEAR_VALUE).

Illustrated processing block 130 provides for dividing the sorted or ranked drives into M groups, with each group having X (or approximately X) drives. X may be determined, e.g., based on a percentage of the total number of drives in the solution, or may be determined based on other criteria. Each group may be assigned a group number (e.g., ranging from 1-M). In some embodiments, the grade for the drives may be assigned to the group as a whole (e.g., based on average WEAR_VALUE for the group).

Within each group, drives are managed to receive even wear. This may be achieved by checking, in each group m, for skew in the wear level (e.g., wear value) among respective pairs of drives ($D_x$ and $D_y$) of the group, as shown in illustrated processing block 140. Respective pairs of drives ($D_x$ and $D_y$) may be selected based on, for example, the drives having the largest and smallest WEAR-VALUE in the group, then a next pair selected based on drives having the largest and smallest WEAR-VALUE of the remaining drives in the group, and so on until all drives in the group have been considered. In other words, drive pairs may be selected from drives at opposite ends of the sorted or ranked list of drives for the group.

When drives are being rotated within a group (or grade bucket), the ROTATION_COUNTER value may be checked to see if a drive has already undergone rotation more than the average for the group. In some embodiments, the ROTATION_COUNTER value for a drive may be checked upon being selected as one of a pair of drives for wear evaluation. If the ROTATION_COUNTER value for the drive is greater than the average of the ROTATION_COUNTER values for the drives in that group, that drive is skipped and the next drive on the list is substituted in the pair (and its ROTATION_COUNTER value may be checked). Alternatively, in some embodiments, the ROTATION_COUNTER value for a drive may be checked prior to pairing to see if it is greater than an average of the ROTATION_COUNTER values for the drives in that group; if so, the drive is skipped without pairing.

Illustrated processing block 150 provides for determining if the difference between WEAR_VALUE for a pair of drives ($D_x$ vs $D_y$) is greater than a specified wear skew threshold $\Delta_t$. If the difference is greater than $\Delta_t$, then at illustrated processing block 155 the ROTATION_COUNTER value for each drive of the pair of drives may checked (if not checked previously at block 140) to see if it is greater than an average of the ROTATION_COUNTER values for the drives in that group. If yes (i.e., drive ROTATION_COUNTER value is greater than average), the drive (or drives) having greater than average ROTATION_COUNTER value is skipped and at illustrated processing block 157 the next drive (or drives) is substituted into the pair (for $D_x$ and/or $D_y$, respectively), and the process returns to block 150 for evaluation against the wear skew threshold condition. If the ROTATION_COUNTER value for each drive in the drive pair is less than the average ROTATION_COUNTER value for the group, the process then continues with swapping the drive content for this pair at block 160. If the ROTATION_COUNTER value was already checked for the drives in the pair (at block 140), the check of ROTATION_COUNTER value is not performed at block 155 and the process then continues with swapping the drive content for this pair at block 160.

Continuing with illustrated processing block 150, if the difference between WEAR_VALUE for the pair of drives ($D_x$ vs $D_y$) is less than or equal to $\Delta_t$, the process skips swapping the drive content for this pair and proceeds to block 180. It will be understood that the evaluation against wear skew threshold (block 150) and the evaluation of rotation count (block 155) may be performed in reverse order, such that the evaluation at block 155 may be performed before the evaluation at block 150.

Illustrated processing block 160 provides for swapping (i.e., interchanging) the content between drives $D_x$ and $D_y$ in this drive pair. In some embodiments, all contents of each drive may be swapped to the other drive. In some embodiments, only a portion of the contents of each drive may be swapped between the drives. As an example, only the hot files of the drive with greater wear may be swapped for files of the lesser-worn drive.

At illustrated processing block 170, the ROTATION_COUNTER for drives $D_x$ and $D_y$ in the drive pair is incremented, since the drives swapped content in block 160.

Illustrated processing block 180 provides for checking to see if there are additional drive pairs in the drive group to be evaluated. If yes, the next drive pair is selected at block 185 and the process returns to block 150, where the next pair of drives is evaluated. If there are no additional drive pairs for the group, the process continues with block 190.

Illustrated processing block 190 provides for checking to see if there are additional drive groups to be evaluated. If yes, the next drive group may be selected at illustrated processing block 195, and the process returns to block 140 and that group of drives is evaluated. At illustrated processing block 195 a group number (m) representing the next group of drives to be evaluated may be set. If the group number m is already set to M (the total number of drive groups) at block 190, this would indicate there are no further drive groups to be evaluated. At block 190, if there are no more drive groups, the process reaches the end of the current loop. The process may then return to start, to re-start the process over again. In some embodiments, the process may be repeated at periodic or various intervals.

The wear management process as described above may be repeated at various or periodic intervals (e.g., first cycle, second cycle, etc.) throughout drive lifetime. For example, in some embodiments, the process may be scheduled to run at certain times or certain days, weeks, etc. In some embodiments the process may be repeated on a continual (or near-continual) basis.

At various or periodic intervals, after drives are sorted and divided into groups based on WEAR-VALUE (or grade), an average may be determined for the WEAR_VALUE(s) of the drives in each group. If, for a given group, the average exceeds a potential drive failure threshold, the drives in that group may be marked for serviceability. For example, maintenance service may be provided for the drives in the group. The potential drive failure threshold may be determined or selected based on a level of WEAR_VALUE representing, for example, an expected failure or elevated risk of failure within a future period of time.

FIGS. 2A-2F provide diagrams illustrating an example of drive wear management according to one or more embodiments, with reference to components and features described herein including but not limited to the figures and associated description. The example drive wear management as illustrated in FIGS. 2A-2F and described herein may be performed, e.g., via process 105 (FIG. 1B, already discussed).

FIG. 2A illustrates an array 202 of N drives for N=16. Each of the drives may be identified with a drive number ranging from 1 to N (i.e., $D_1$-$D_{16}$).

FIG. 2B illustrates an array 204 of the 16 drives, showing a state of each drive including a content of the drive and a wear value (e.g., WEAR_VALUE as in FIG. 1B, already discussed) determined for the drive. The drive contents are shown, for purposes of illustration, as a single letter (i.e., labeled A though P) to distinguish between content in each of the drives. The letter or label does not otherwise limit or categorize the actual content of the drives. Thus, each drive may include content as, e.g., images, metadata, files, blocks, etc. As illustrated in FIG. 2B, the wear value determined for each drive may range between 0 (no wear) and 1 (highest wear). For example, illustrated drive $D_1$ includes content labeled A and has a present wear value of 0.72; illustrated drive $D_2$ includes content labeled B and has a present wear value of 0.5; illustrated drive $D_3$ includes content labeled C and has a present wear value of 0.4, and so on, through illustrated drive $D_{16}$ which includes content labeled P and has a present wear value of 0.3.

In FIG. 2C, the illustrated drives have been sorted by wear value (ordered from lowest to highest wear value) and grouped into four (4) groups of drives 206a-206d, with each group having four (4) drives ordered by increasing wear value. As illustrated in FIG. 2C, the drives may be grouped based on the wear value. For purposes of illustration, the groups of drives have been labeled as Group 1, Group 2, Group 3 and Group 4, respectively. Thus, as shown in the example, illustrated Group 1 contains the drives in the array having lowest wear value: $D_7$ and $D_8$ each have a wear value of 0, $D_{11}$ has a wear value of 0.02, and $D_5$ has a wear value of 0.1. Further, as shown in the example, illustrated Group 4 contains the drives in the array having highest wear value: $D_{13}$ has a wear value of 0.55, $D_9$ has a wear value of 0.6, $D_1$ has a wear value of 0.72 and $D_{14}$ has a wear value of 0.8. Each drive in FIG. 2C includes the same content for the respective drive as shown in FIG. 2B.

Drive pairs in each group may be checked for skew in wear level. For illustrative purposes, the drive pairs may be evaluated using an example wear skew threshold $\Delta_t$ set to 0.1; accordingly, for a pair of drives in a group to undergo rotation (content swapping), the difference in wear value for the drive pair should be greater than 0.1. Considering the drives in Group 1 (FIG. 2C), a first pair of drives may be selected from drives at the opposite ends of the group: $D_5$ and $D_7$ have a difference in wear value of 0.1 (0.1−0), which is equal to (but not greater than) $\Delta_t$. Similarly, the next pair of drives may be selected from the two remaining drives in the list of Group 1: $D_{11}$ and $D_8$ have a difference in wear value of 0.02 (0.02−0), which is less than $\Delta_t$. Accordingly, since neither pair of drives in Group 1 have a difference in wear value greater than the wear skew threshold $\Delta_t$ (set in this example to 0.1), no content will be swapped between drives in either pair of drives in Group 1. In some embodiments, where (as in this example) the outermost pair of drives in a group—representing the pair with the largest wear value differential in the group—has a difference in wear value that is not greater than the wear skew threshold $\Delta_t$, then the remaining drives in the same group may be skipped without determining the wear value differential.

Continuing with the drive groups in FIG. 2C, the drives in Group 2 may be checked for skew in wear level. A first pair of drives may be selected from drives at the opposite ends of the group: $D_{12}$ and $D_4$ have a difference in wear value of 0.13 (0.33−0.2), which is greater than $\Delta_t$. A second pair of drives may be selected from the two remaining drives in the list of Group 2: $D_{16}$ and $D_6$ have a difference in wear value of 0.05 (0.3−0.25), which is less than $\Delta_t$. Accordingly, since the first pair of drives ($D_{12}$ and $D_4$) has a wear value differential which is greater than $\Delta_t$, content from $D_{12}$ will be swapped with content from $D_4$. However, since the second pair of drives ($D_{16}$ and $D_6$) has a wear value differential which is less than $\Delta_t$, no content will be swapped between these two drives.

FIG. 2D illustrates the state of the drives in Group 2 before and after the content swap. At label 210, the four drives in Group 2 are shown in the same order and state (content and wear value) as shown in FIG. 2C for Group 2, before swapping of content. Since the first pair of drives ($D_{12}$ and $D_4$) has a wear value differential which is greater than $\Delta_t$, content L from $D_{12}$ is swapped with content D from $D_4$. This is illustrated via the top arrow 212 signifying a content transfer from $D_{12}$ to $D_4$) and the bottom arrow 214 signifying a content transfer from $D_4$ to Die. Since the second pair of drives ($D_{16}$ and $D_6$) has a wear value differential which is less than $\Delta_t$, no content will be swapped between these two drives, and thus no arrows are shown between these two drives. At label 216, the four drives in Group 2 are shown in the same order (and having the same wear value) after the content swap, such that after the swap drive $D_{12}$ now contains content D (from $D_4$), and drive $D_4$ now contains content L (from $D_{12}$).

Returning to the drive groups in FIG. 2C, the drives in Group 3 may be checked for skew in wear level. A first pair of drives may be selected from drives at the opposite ends of the group: $D_{15}$ and $D_3$ have a difference in wear value of 0.1 (0.5−0.4), which is equal to (but not greater than) $\Delta_t$. Similarly, the next pair of drives may be selected from the two remaining drives in the list of Group 3: $D_2$ and $D_{10}$ have a difference in wear value of 0.08 (0.5−0.42), which is less than $\Delta_t$. Accordingly, since neither pair of drives in Group 3 have a difference in wear value greater than the wear skew threshold $\Delta_t$ (set to 0.1), no content will be swapped between drives in either pair of drives in Group 3.

Continuing with the drive groups in FIG. 2C, the drives in Group 4 may be checked for skew in wear level. A first pair of drives may be selected from drives at the opposite ends of the group: $D_{14}$ and $D_{13}$ have a difference in wear value of 0.25 (0.8–0.55), which is greater than $\Delta_t$. Similarly, a second pair of drives may be selected from the two remaining drives in the list of Group 4: $D_1$ and $D_9$ have a difference in wear value of 0.12 (0.72–0.6), which is also greater than $\Delta_t$. Accordingly, since the first pair of drives ($D_{14}$ and $D_{13}$) has a wear value differential which is greater than $\Delta_t$, content from $D_{14}$ will be swapped with content from $D_{13}$. In addition, since the second pair of drives ($D_1$ and $D_9$) also has a wear value differential which is greater than $\Delta_4$, content from $D_1$ will be swapped with content from $D_9$.

Figures 2E, 2F, 3A, 3B:
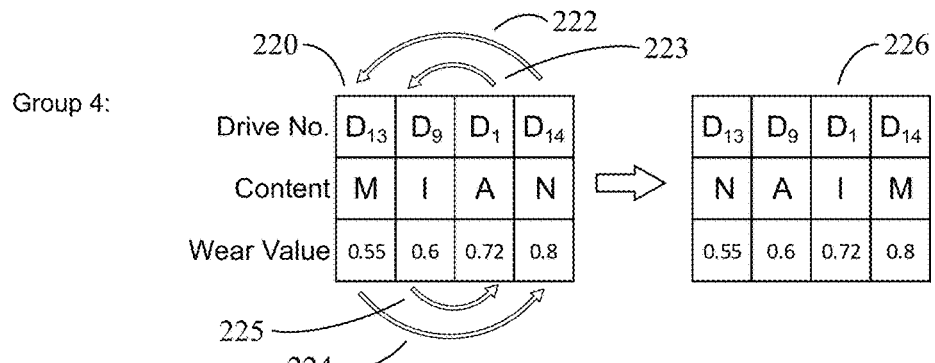

FIG. 2E illustrates the state of the drives in Group 4 before and after the content swap. At label 220, the four drives in Group 4 are shown in the same order and state (content and wear value) as shown in FIG. 2C for Group 4, before swapping of content. Since the first pair of drives ($D_{14}$ and $D_{13}$) has a wear value differential which is greater than $\Delta_t$, content N from $D_{14}$ is swapped with content M from $D_{13}$. This is illustrated via the top arrow 222 signifying a content transfer from $D_{14}$ to $D_{13}$ and the bottom arrow 224 signifying a content transfer from $D_{13}$ to $D_{14}$. Since the second pair of drives ($D_1$ and $D_9$) also has a wear value differential which is greater than $\Delta_t$, content A from $D_1$ is swapped with content I from $D_9$. This is illustrated via the upper middle arrow 223 signifying a content transfer from $D_1$ to $D_9$ and the lower middle arrow 225 signifying a content transfer from $D_9$ to $D_1$. At label 226, the four drives in Group 4 are shown in the same order (and having the same wear value) after the content swap, such that after the swap drive $D_{14}$ now contains content M (from $D_{13}$), and drive $D_{13}$ now contains content N (from $D_{14}$). Likewise, at label 226 after the swap drive $D_1$ now contains content I (from $D_9$), and drive $D_9$ now contains content A (from $D_1$).

FIG. 2F illustrates the state of the four groups of drives after the swapping of content described with reference to FIGS. 2D-2E. The drives in Group 1 and Group 3 have the same state (wear value and content) as shown in FIG. 2C (labels 206a and 206c, respectively), because no files were swapped between drives in these groups. The drives in Group 2 are shown as in the post-swap state illustrated in FIG. 2D (label 216). Similarly, the drives in Group 4 are shown as in the post-swap state illustrated in FIG. 2E (label 226). In some embodiments, once the drive swaps are completed for the current cycle, an average may be determined for the wear value(s) of the drives in each group. If, for a given group, the average exceeds a potential drive failure threshold, the drives in that group may be marked for serviceability.

Although the example illustrated in the diagrams in FIG. 2 does not show a rotation counter value, it will be understood that the rotation counter value for each of the illustrated drives in this example would be the same value (e.g., a value of 0 if representative of a first loop or cycle of the wear management process) such that rotation counter value would not impact the selected drive pairs.

FIGS. 3A-3F provide diagrams illustrating another example of drive wear management according to one or more embodiments, with reference to components and features described herein including but not limited to the figures and associated description. The example drive wear management as illustrated in FIGS. 3A-3F and described herein may be performed, e.g., via process 105 (FIG. 1B, already discussed).

FIG. 3A illustrates an array 304 of 16 drives, with each of the drives identified with a drive number ranging from 1 to N (i.e., $D_1$-$D_{16}$). Shown for each drive is a state of the drive including a content of the drive, a wear value (e.g., WEAR_VALUE as in FIG. 1B, already discussed) determined for the drive, and a rotation counter (e.g., ROTATION_COUNTER as in FIG. 1B, already discussed) for the drive. Similar to FIG. 2B, the drive contents are shown, for purposes of illustration, as a single letter (i.e., labeled A though P) to distinguish between content in each of the drives, and the wear value determined for each drive ranges between 0 (no wear) and 1 (highest wear). For example, illustrated drive $D_1$ includes content labeled A, has a present wear value of 0.72 and a rotation counter equal to 1; illustrated drive $D_2$ includes content labeled B, has a present wear value of 0.61 and a rotation counter equal to 0; illustrated drive $D_3$ includes content labeled C and has a present wear value of 0.41 and a rotation counter equal to 0, and so on, through illustrated drive $D_{16}$ which includes content labeled P, has a present wear value of 0.3 and a rotation counter equal to 0.

In FIG. 3B, the illustrated drives have been sorted by wear value (ordered from lowest to highest wear value) and grouped into four (4) groups of drives 306a-306d, with each group having four (4) drives ordered by increasing wear value. As illustrated in FIG. 3B, the drives may be grouped based on the wear value. For purposes of illustration, the groups of drives have been labeled as Group 1, Group 2, Group 3 and Group 4, respectively. Thus, as shown in the example, illustrated Group 1 contains the drives in the array having lowest wear value: $D_8$ has a wear value of 0, $D_7$ has a wear value of 0.02, $D_{11}$ has a wear value of 0.05, and $D_5$ has a wear value of 0.1. Further, as shown in the example, illustrated Group 4 contains the drives in the array having highest wear value: $D_9$ has a wear value of 0.63, $D_{13}$ has a wear value of 0.7, $D_1$ has a wear value of 0.72 and $D_{14}$ has a wear value of 0.8. Each drive in FIG. 3B includes the same content for the respective drive as shown in FIG. 3A.

Drive pairs in each group may be checked for skew in wear level. For illustrative purposes, the drive pairs may be evaluated using an example wear skew threshold $\Delta_t$ set to 0.1 Considering the drives in Group 1 (FIG. 3B), the average rotation counter value for the group is 0, which is determined by dividing the sum of rotation counters for each of the drives in Group 1 (0) by the number of drives in the group (4). Since none of the drives in the group has a rotation counter exceeding the average, none of the drives in the group will be skipped due to rotation counter value. A first pair of drives may be selected from drives at the opposite ends of Group 1: $D_5$ and $D_8$ have a difference in wear value of 0.1 (0.1–0), which is equal to (but not greater than) $\Delta_t$. Similarly, the next pair of drives may be selected from the two remaining drives in the list of Group 1: $D_{11}$ and $D_7$ have a difference in wear value of 0.03 (0.05–0.02), which is less than $\Delta_t$. Accordingly, since neither pair of drives in Group 1 have a difference in wear value greater than the wear skew threshold $\Delta_t$ (set in this example to 0.1), no content will be swapped between drives in either pair of drives in Group 1. In some embodiments, where (as in this example) the outermost pair of drives in a group—representing the pair with the largest wear value differential—has a difference in wear value that is not greater than the wear skew threshold $\Delta_t$, then the remaining drives in the same group may be skipped without determining the wear value differential.

Continuing with the drive groups in FIG. 3B, the drives in Group 2 may be checked for skew in wear level. The average rotation counter value for Group 2 is 0.25, which is determined by dividing the sum of rotation counters for each of the drives in Group 2 (1) by the number of drives in the group (4). A first pair of drives may be selected from drives at the opposite ends of the group: $D_3$ and $D_4$. Since the rotation counter for $D_4$ (namely, 1) is greater than the average rotation counter value for the group (0.25), however, drive $D_4$ is skipped and the next drive, $D_{16}$, is considered. $D_3$ and $D_{16}$ have a difference in wear value of 0.11 (0.41–0.3), which is greater than $\Delta_t$. Accordingly, since this pair of drives ($D_3$ and $D_{16}$) has a wear value differential which is greater than $\Delta_t$, and both drives have a rotation counter value less than the average rotation counter value, content from $D_3$ will be swapped with content from $D_{16}$. The remaining drive, $D_6$, will also be skipped in this cycle.

FIG. 3C illustrates the state of the drives in Group 2 before and after the content swap. At label 310, the four drives in Group 2 are shown in the same order and state (content, wear value and rotation counter) as shown in FIG. 3B for Group 2, before swapping of content. Since the pair of drives ($D_3$ and $D_{16}$) has a wear value differential which is greater than $\Delta_t$, content C from $D_3$ is swapped with content P from $D_{16}$. This is illustrated via the top arrow 312 signifying a content transfer from $D_3$ to $D_{16}$ and the bottom arrow 314 signifying a content transfer from $D_{16}$ to $D_3$. At label 316, the four drives in Group 2 are shown in the same order (and having the same wear value) after the content swap, such that after the swap drive $D_3$ now contains content P (from $D_{16}$) and its rotation counter has been incremented to 1, and drive $D_{16}$ now contains content C (from $D_3$) and its rotation counter has also been incremented to 1.

Returning to the drive groups in FIG. 3B, the drives in Group 3 may be checked for skew in wear level. The average rotation counter value for Group 3 is 0.25, which is determined by dividing the sum of rotation counters for each of the drives in Group 3 (1) by the number of drives in the group (4). A first pair of drives may be selected from drives at the opposite ends of the group: $D_2$ and $D_{12}$. Since the rotation counter for $D_{12}$ (1) is greater than the average rotation counter value for the group (0.25), however, drive $D_{12}$ is skipped and the next drive, $D_{10}$, is considered. $D_2$ and $D_{10}$ have a difference in wear value of 0.19 (0.61–0.42), which is greater than $\Delta_t$. Accordingly, since this pair of drives ($D_2$ and $D_{10}$) has a wear value differential which is greater than $\Delta_t$, and both drives have a rotation counter value less than the average rotation counter value, content from $D_2$ will be swapped with content from $D_{10}$. The remaining drive, $D_{15}$, will also be skipped in this cycle.

FIG. 3D illustrates the state of the drives in Group 3 before and after the content swap. At label 320, the four drives in Group 3 are shown in the same order and state (content, wear value and rotation counter) as shown in FIG. 3B for Group 3, before swapping of content. Since the pair of drives ($D_2$ and $D_{10}$) has a wear value differential which is greater than $\Delta_t$, content B from $D_2$ is swapped with content J from $D_{10}$. This is illustrated via the top arrow 322 signifying a content transfer from $D_2$ to $D_{10}$ and the bottom arrow 324 signifying a content transfer from $D_{10}$ to $D_2$. At label 326, the four drives in Group 3 are shown in the same order (and having the same wear value) after the content swap, such that after the swap drive $D_2$ now contains content J (from $D_{10}$) and its rotation counter has been incremented to 1, and drive $D_{10}$ now contains content B (from $D_2$) and its rotation counter has also been incremented to 1.

Returning to the drive groups in FIG. 3B, the drives in Group 4 may be checked for skew in wear level. The average rotation counter value for the group is 1, as all drives in the group have a rotation counter equal to 1. Since none of the drives in the group has a rotation counter exceeding the average, none of the drives in the group will be skipped due to rotation counter value. A first pair of drives may be selected from drives at the opposite ends of the group: $D_{14}$ and $D_9$ have a difference in wear value of 0.17 (0.8–0.63), which is greater than $\Delta_t$. A second pair of drives may be selected from the two remaining drives in the list of Group 4: $D_1$ and $D_{13}$ have a difference in wear value of 0.02 (0.72–0.7), which is less than $\Delta_t$. Accordingly, since the first pair of drives ($D_{14}$ and $D_9$) has a wear value differential which is greater than $\Delta_t$, content from $D_{14}$ will be swapped with content from $D_9$. However, since the second pair of drives ($D_1$ and $D_{13}$) has a wear value differential which is less than $\Delta_t$, no content will be swapped between these two drives.

FIG. 3E illustrates the state of the drives in Group 4 before and after the content swap. At label 330, the four drives in Group 4 are shown in the same order and state (content, wear value and rotation counter) as shown in FIG. 3B for Group 4, before swapping of content. Since the pair of drives ($D_{14}$ and $D_9$) has a wear value differential which is greater than $\Delta_t$, content N from $D_{14}$ is swapped with content I from $D_9$. This is illustrated via the top arrow 332 signifying a content transfer from $D_{14}$ to $D_9$ and the bottom arrow 334 signifying a content transfer from $D_9$ to $D_{14}$. At label 336, the four drives in Group 4 are shown in the same order (and having the same wear value) after the content swap, such that after the swap drive $D_{14}$ now contains content I (from $D_9$) and its rotation counter has been incremented to 2, and drive $D_9$ now contains content N (from $D_{14}$) and its rotation counter has also been incremented to 2.

FIG. 3F illustrates the state of the four groups of drives after the swapping of content described with reference to FIGS. 3C-3E. The drives in Group 1 have the same state (content, wear value and rotation counter) as shown in FIG. 3B (label 306a), because no files were swapped between drives in these groups. The drives in Groups 2, 3 and 4 are shown as in the post-swap state illustrated respectively in FIG. 3C (Group 2, label 316), FIG. 3D (Group 3, label 326) and FIG. 3E (Group 4, label 336). In some embodiments, once the drive swaps are completed for the current cycle, an average may be determined for the wear value(s) of the drives in each group. If, for a given group, the average exceeds a potential drive failure threshold, the drives in that group may be marked for serviceability.

It will be understood that the examples of drive wear management illustrated in FIG. 2A-2F or 3A-3F may be implemented using different wear skew threshold values $\Delta_t$ and/or different rotation counter evaluations than as was shown and described herein. For example, differences in rotation counter may be evaluated using a threshold rather than evaluating the average rotation counter value. It will be further understood that the example drive contents that are swapped as described may include contents such as, e.g., images, metadata, files, blocks, etc., and the contents actually swapped may include all portions of the drive or only some portions (e.g., hot files).

Additionally, it will be understood that the approach of rotating drives as described herein may be applied to drives within a tier (e.g., drives within a capacity tier, or drives within a cache tier), as drives within a tier are typically of a common drive type having similar drive characteristics. In some embodiments, where drives in cache tier(s) and in capacity tier(s) may be of a common or similar type, drive rotation as described herein may be extended to rotating drives between the cache and capacity tiers of a storage subsystem.

Figure 4A:
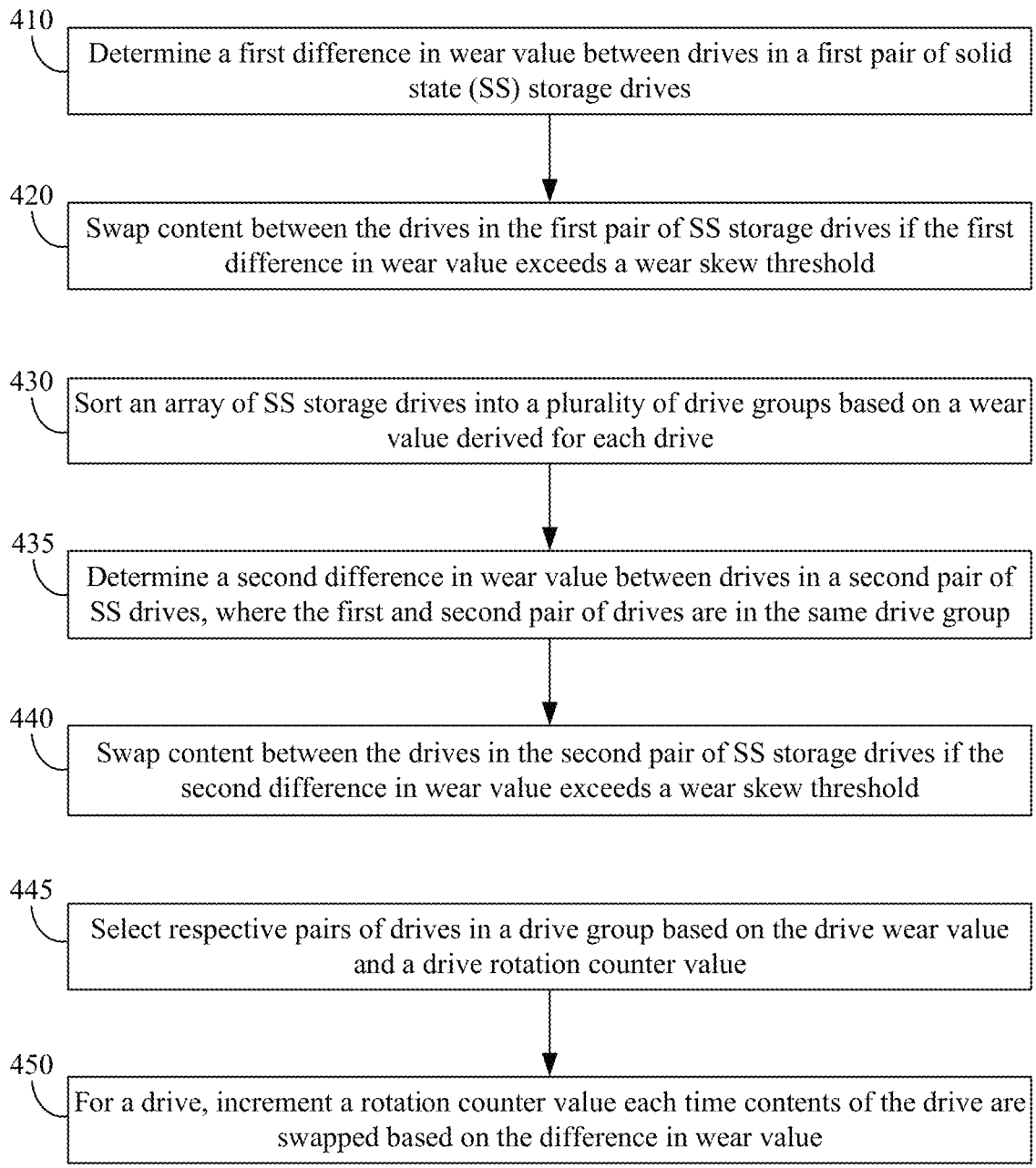
FIGS. 4A-4B provide flowcharts illustrating an example process for managing drive wear according to one or more embodiments.
Figure 4B:
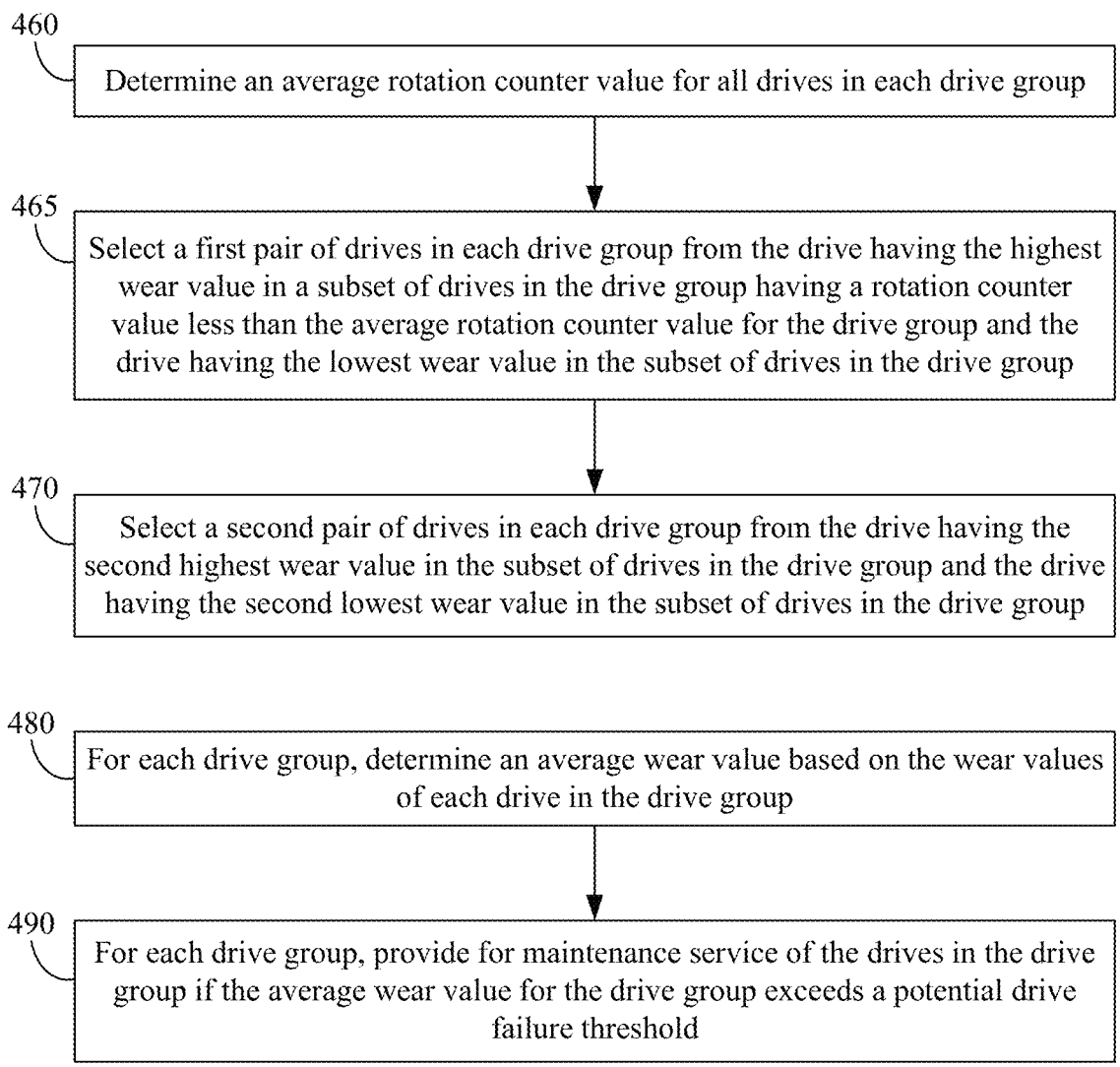

FIGS. 4A-4B provide flowcharts illustrating an example process 400 for managing drive wear according to one or more embodiments, with reference to components and features described herein including but not limited to the figures and associated description. The process 400 may be implemented in the a computing system such as, e.g., computing system 100 (FIG. 1A, already discussed) or computing system 10 (described herein with reference to FIG. 5). Process 400 may be performed by or under direction of an operating system running on computing system 100 or computing system 10. More particularly, the process 400 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

For example, computer program code to carry out operations shown in process 400 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/ or other structural components that are native to hardware (e.g., host processor, central processing unit/CPU, microcontroller, etc.).

A computing system implementing process flow 400 for managing drive wear may include, or be in data communication with, an array of storage drives. The drives may be solid state (SS) drives. The drive array may include a number of drives (N) for which it is desired to manage the drive wear. A wear value (e.g. WEAR_VALUE as described above) may be derived for each SS drive.

Turning to FIG. 4A, at illustrated processing block 410, a first difference in wear value may be determined between drives in a first pair of SS storage drives. At illustrated processing block 420, content may be swapped between the drives in the first pair of SS storage drives if the first difference in wear value exceeds a wear skew threshold. Swapping content between the drives may, e.g., include one of swapping all files between a first drive in the pair and a second drive in the pair or swapping hot files between a first drive in the pair and a second drive in the pair.

At illustrated processing block 430, an array of solid state (SS) storage drives may be sorted into a plurality of drive groups based on a wear value (e.g. WEAR_VALUE as described above) derived for each drive. Sorting the drives into a plurality of drive groups may include sorting (or ranking) the drives based on their respective wear value and dividing the ranked drives into M groups, with each group having X (or approximately X) drives. X may be determined, e.g., based on a percentage of the total number of drives in the solution, or may be determined based on other criteria. Within a drive group, drives may be sorted by wear value, such that drive pairs may be selected from drives at opposite ends of the sorted group of drives. In addition, each drive in a drive group may have an associated rotation counter value (e.g. ROTATION_COUNTER as described above), such that respective pairs of drives in a drive group may be selected based on the drive wear value and the drive rotation counter value.

At illustrated processing block 435, a second difference in wear value may be determined between drives in a second pair of drives in a drive group. The first pair of SS drives and the second pair of SS drives may be in the same drive group. At illustrated processing block 440, content may be swapped between the drives in the second pair of SS storage drives if the second difference in wear value exceeds the wear skew threshold. Swapping content between the drives may, e.g., include one of swapping all files between a first drive in the pair and a second drive in the pair or swapping hot files between a first drive in the pair and a second drive in the pair.

In embodiments, the wear value for each drive may be derived based on one or more of a size of the drive, a number of program or erase cycles for the drive, a total host or NAND bytes written to the drive, a write amplification factor for the drive, a total number of failed blocks for the drive, a number of remaining reserve blocks for the drive, a warranty end date for the drive, or a device temperature for the drive. In embodiments, the wear skew threshold may be set based on one or more of an expected frequency of drive rotation and a desired frequency of drive rotation.

At illustrated processing block 445, respective pairs of drives in a drive group may be selected based on the drive wear value and a drive rotation counter value, where each drive in a drive group has an associated rotation counter value. At illustrated processing block 450, for a drive, a rotation counter value may be incremented each time drive contents are swapped based on the difference in wear value.

Turning now to FIG. 4B, at illustrated processing block 460, an average rotation counter value may be determined for all drives in each drive group. At illustrated processing block 465, a first pair of the respective pairs of drives in each drive group may be selected from the drive having the highest wear value in a subset of drives in the drive group having a rotation counter value less than the average rotation counter value for the drive group and the drive having the lowest wear value in the subset of drives in the drive group. At illustrated processing block 470, a second pair of the respective pairs of drives in each drive group may be selected from the drive having the second highest wear value in the subset of drives in the drive group and the drive having the second lowest wear value in the subset of drives in the drive group. The functions provided in illustrated processing blocks 460, 465 and 470 may be substituted for the function provided in illustrated processing block 445, already discussed.

At illustrated processing block 480, for each drive group, an average wear value may be determined based on the wear values of each drive in the drive group. At illustrated processing block 490, maintenance service may be provided for the drives in the drive group if the average wear value for the drive group exceeds a potential drive failure threshold. In embodiments, the potential drive failure threshold may be determined or selected based on a wear value representing, for example, an expected failure or elevated risk of failure within a future period of time.

In embodiments, where the rotation counter value for each of the drives in a drive group is the same, a first pair of the respective pairs of drives in each drive group may be selected from the drive having the highest wear value in the drive group and the drive having the lowest wear value in the drive group, and a second pair of the respective pairs of drives in each drive group may be selected from the drive having the second highest wear value in the drive group and the drive having the second lowest wear value in the drive group.

Figure 5:
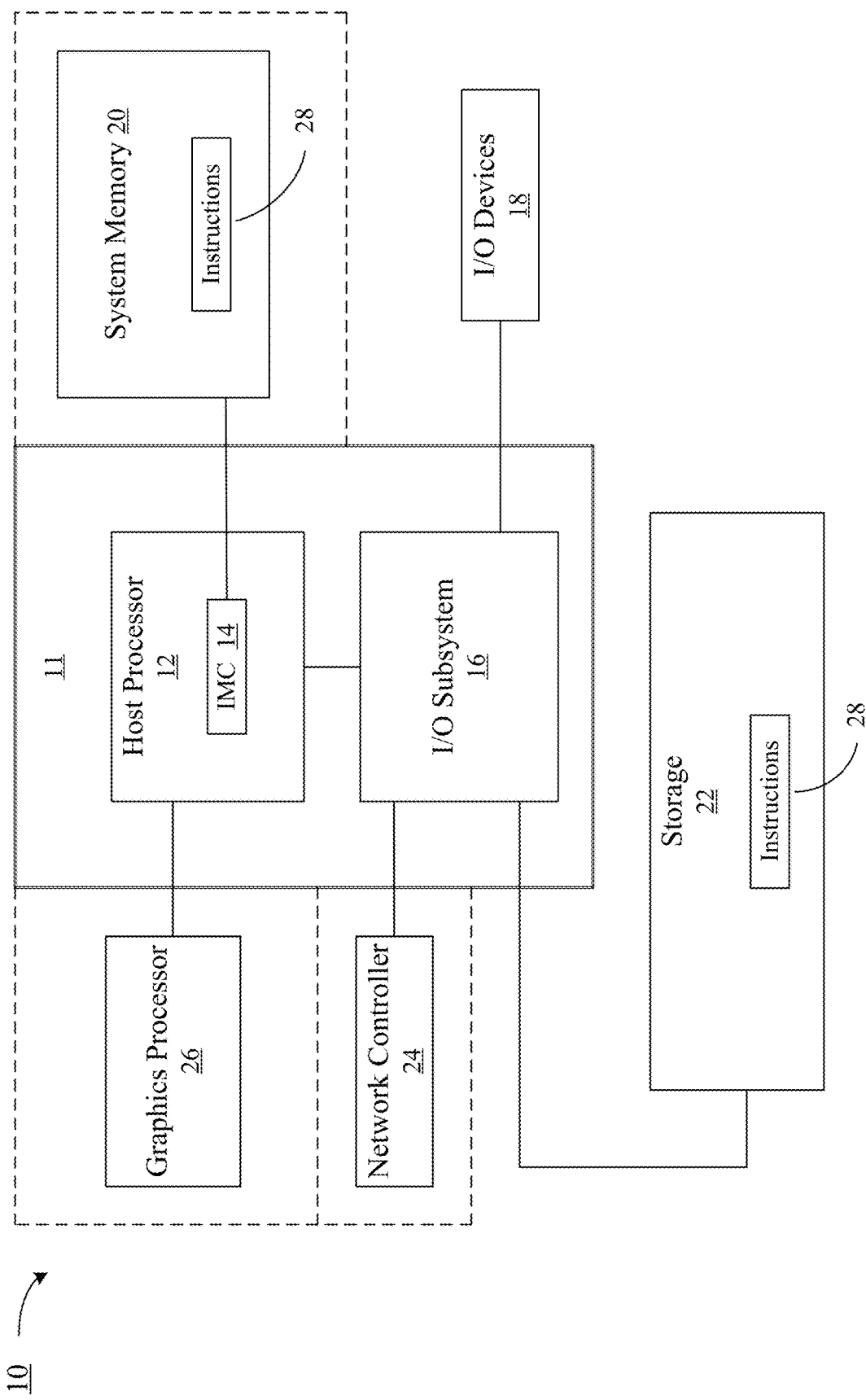
FIG. 5 provides a block diagram illustrating an example system for drive wear management according to one or more embodiments.

FIG. 5 shows a block diagram illustrating an example computing system 10 for intelligent drive wear management according to one or more embodiments, with reference to components and features described herein including but not limited to the figures and associated description. The system 10 may generally be part of an electronic device/platform having computing and/or communications functionality (e.g., server, cloud infrastructure controller, database controller, notebook computer, desktop computer, personal digital assistant/PDA, tablet computer, convertible tablet, smart phone, etc.), imaging functionality (e.g., camera, camcorder), media playing functionality (e.g., smart television/TV), wearable functionality (e.g., watch, eyewear, headwear, footwear, jewelry), vehicular functionality (e.g., car, truck, motorcycle), robotic functionality (e.g., autonomous robot), Internet of Things (IoT) functionality, etc., or any combination thereof. In the illustrated example, the system 10 may include a host processor 12 (e.g., central processing unit/CPU) having an integrated memory controller (IMC) 14 that may be coupled to system memory 20. The host processor 12 may include any type of processing device, such as, e.g., microcontroller, microprocessor, RISC processor, ASIC, etc., along with associated processing modules or circuitry. The system memory 20 may include any non-transitory machine- or computer-readable storage medium such as RAM, ROM, PROM, EEPROM, firmware, flash memory, etc., configurable logic such as, for example, PLAs, FPGAs, CPLDs, fixed-functionality hardware logic using circuit technology such as, for example, ASIC, CMOS or TTL technology, or any combination thereof suitable for storing instructions 28.

The system 10 may also include an input/output (I/O) subsystem 16. The I/O subsystem 16 may communicate with for example, one or more input/output (I/O) devices 17, a network controller 24 (e.g., wired and/or wireless NIC), and storage 22. The storage 22 may be comprised of any appropriate non-transitory machine- or computer-readable memory type (e.g., flash memory, DRAM, SRAM (static random access memory), solid state drive (SSD), hard disk drive (HDD), optical disk, etc.). The storage 22 may include mass storage. In some embodiments, the host processor 12 and/or the I/O subsystem 16 may communicate with the storage 22 (all or portions thereof) via a network controller 24. In some embodiments, the system 10 may also include a graphics processor 26 (e.g., a graphics processing unit/GPU).

The host processor 12 and the I/O subsystem 16 may be implemented together on a semiconductor die as a system on chip (SoC) 11, shown encased in a solid line. The SoC 11 may therefore operate as a computing apparatus for intelligent drive wear management. In some embodiments, the SoC 11 may also include one or more of the system memory 20, the network controller 24, and/or the graphics processor 26 (shown encased in dotted lines). In some embodiments, the SoC 11 may also include other components of the system 10.

The host processor 12 and/or the I/O subsystem 16 may execute program instructions 28 retrieved from the system memory 20 and/or the storage 22 to perform one or more aspects of process 105 as described herein with reference to FIG. 1B or process 400 as described herein with reference to FIGS. 4A-4B. The system 10 may implement one or more aspects of system 100 as described herein with reference to FIG. 1A. The system 10 is therefore considered to be performance-enhanced at least to the extent that the technology provides drive wear optimization recommendations to evenly wear storage devices.

Computer program code to carry out the processes described above may be written in any combination of one or more programming languages, including an object-oriented programming language such as JAVA, JAVASCRIPT, PYTHON, SMALLTALK, C++ or the like and/or conventional procedural programming languages, such as the "C" programming language or similar programming languages, and implemented as program instructions 28. Additionally, program instructions 28 may include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, microprocessor, etc.).

I/O devices 17 may include one or more of input devices, such as a touch-screen, keyboard, mouse, cursor-control device, touch-screen, microphone, digital camera, video recorder, camcorder, biometric scanners and/or sensors; input devices may be used to enter information and interact with system 10 and/or with other devices. The I/O devices 17 may also include one or more of output devices, such as a display (e.g., touch screen, liquid crystal display/LCD, light emitting diode/LED display, plasma panels, etc.), speakers and/or other visual or audio output devices. The input and/or output devices may be used, e.g., to provide a user interface.

Figure 6:
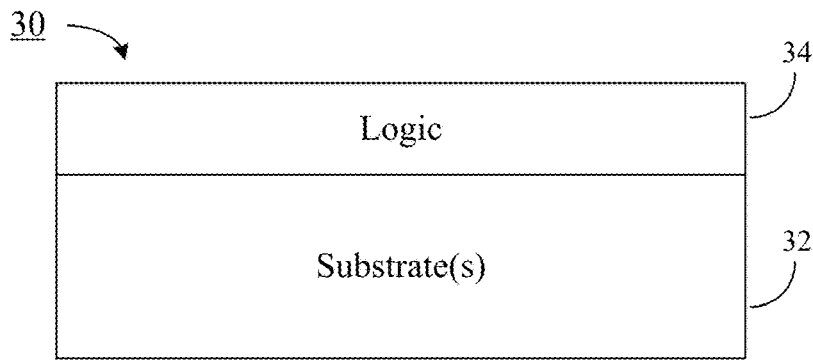
FIG. 6 is a block diagram illustrating an example semiconductor apparatus for drive wear management according to one or more embodiments.

FIG. 6 shows a block diagram illustrating an example semiconductor apparatus 30 for intelligent drive wear management according to one or more embodiments, with reference to components and features described herein including but not limited to the figures and associated description. The semiconductor apparatus 30 may be implemented, e.g., as a chip, die, or other semiconductor package. The semiconductor apparatus 30 may include one or more substrates 32 comprised of, e.g., silicon, sapphire, gallium arsenide, etc. The semiconductor apparatus 30 may also include logic 34 comprised of, e.g., transistor array(s) and other integrated circuit (IC) components) coupled to the substrate(s) 32. The logic 34 may be implemented at least partly in configurable logic or fixed-functionality logic hardware. The logic 34 may implement the system on chip (SoC) 11 described above with reference to FIG. 5. The logic 34 may implement one or more aspects of the processes described above, including process 105 as described herein with reference to FIG. 1B or process 400 as described herein with reference to FIGS. 4A-4B. The logic 34 may implement one or more aspects of the computing system 100 (FIG. 1A, already discussed) or the system 10 (FIG. 5, already discussed). The apparatus 30 is therefore considered to be performance-enhanced at least to the extent that the technology provides drive wear optimization recommendations to evenly wear storage devices.

The semiconductor apparatus 30 may be constructed using any appropriate semiconductor manufacturing processes or techniques. For example, the logic 34 may include transistor channel regions that are positioned (e.g., embedded) within the substrate(s) 32. Thus, the interface between the logic 34 and the substrate(s) 32 may not be an abrupt junction. The logic 34 may also be considered to include an epitaxial layer that is grown on an initial wafer of the substrate(s) 34.

Figure 7:
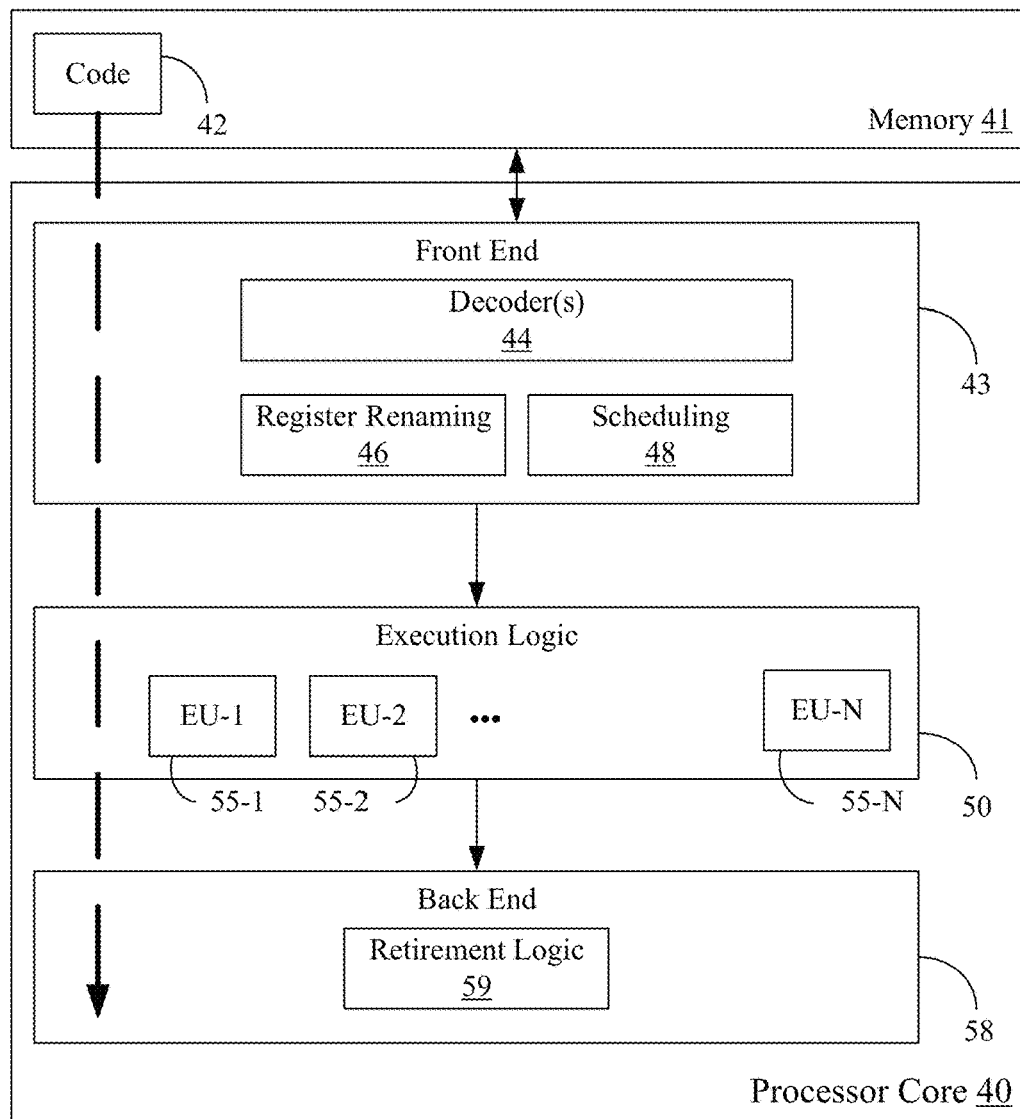
FIG. 7 is a block diagram illustrating an example processor according to one or more embodiments.

FIG. 7 is a block diagram illustrating an example processor core 40 according to one or more embodiments, with reference to components and features described herein including but not limited to the figures and associated description. The processor core 40 may be the core for any type of processor, such as a micro-processor, an embedded processor, a digital signal processor (DSP), a network processor, or other device to execute code. Although only one processor core 40 is illustrated in FIG. 7, a processing element may alternatively include more than one of the processor core 40 illustrated in FIG. 7. The processor core 40 may be a single-threaded core or, for at least one embodiment, the processor core 40 may be multithreaded in that it may include more than one hardware thread context (or "logical processor") per core.

FIG. 7 also illustrates a memory 41 coupled to the processor core 40. The memory 41 may be any of a wide variety of memories (including various layers of memory hierarchy) as are known or otherwise available to those of skill in the art. The memory 41 may include one or more code 42 instruction(s) to be executed by the processor core 40. The code 42 may implement one or more aspects of the processes described above, including processes for intelligent drive wear management as described herein with reference to process 105 (FIG. 1B) and/or process 400 (FIGS. 4A-4B). The processor core 40 may implement one or more aspects of the system 100 (FIG. 1A, already discussed) or system 10 (FIG. 5, already discussed). The processor core 40 may follow a program sequence of instructions indicated by the code 42. Each instruction may enter a front end portion 43 and be processed by one or more decoders 44. The decoder 44 may generate as its output a micro operation such as a fixed width micro operation in a predefined format, or may generate other instructions, microinstructions, or control signals which reflect the original code instruction. The illustrated front end portion 43 also includes register renaming logic 46 and scheduling logic 48, which generally allocate resources and queue the operation corresponding to the convert instruction for execution.

The processor core 40 is shown including execution logic 50 having a set of execution units 55-1 through 55-N. Some embodiments may include a number of execution units dedicated to specific functions or sets of functions. Other embodiments may include only one execution unit or one execution unit that can perform a particular function. The illustrated execution logic 50 performs the operations specified by code instructions.

After completion of execution of the operations specified by the code instructions, back end logic 58 retires the instructions of code 42. In one embodiment, the processor core 40 allows out of order execution but requires in order retirement of instructions. Retirement logic 59 may take a variety of forms as known to those of skill in the art (e.g., re-order buffers or the like). In this manner, the processor core 40 is transformed during execution of the code 42, at least in terms of the output generated by the decoder, the hardware registers and tables utilized by the register renaming logic 46, and any registers (not shown) modified by the execution logic 50.

Although not illustrated in FIG. 7, a processing element may include other elements on chip with the processor core 40. For example, a processing element may include memory control logic along with the processor core 40. The processing element may include I/O control logic and/or may include I/O control logic integrated with memory control logic. The processing element may also include one or more caches.

Figure 8:
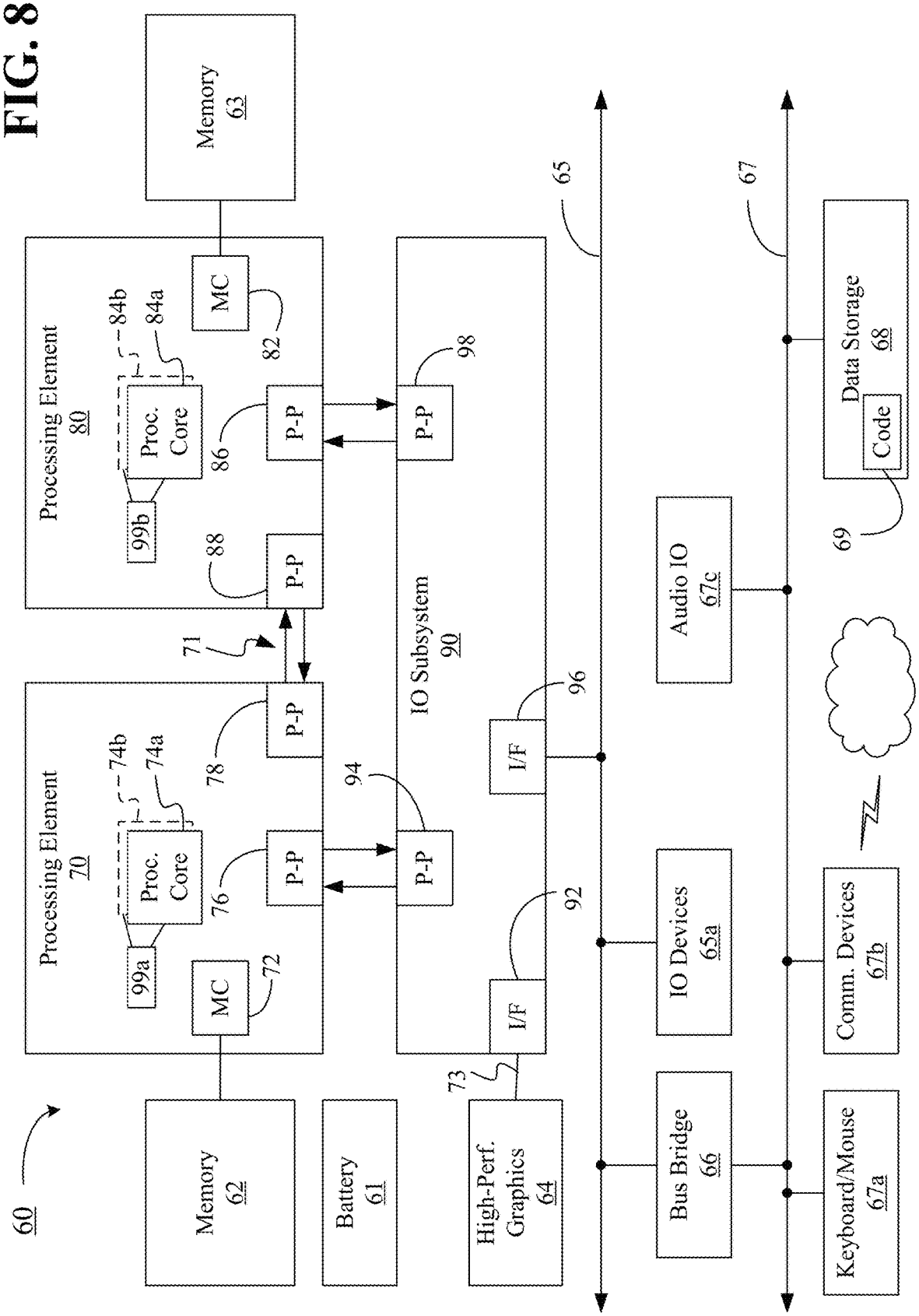
FIG. 8 is a block diagram illustrating an example of a multiprocessor-based computing system according to one or more embodiments.

FIG. 8 is a block diagram illustrating an example of a multi-processor based computing system 60 according to one or more embodiments, with reference to components and features described herein including but not limited to the figures and associated description. The multiprocessor system 60 includes a first processing element 70 and a second processing element 80. While two processing elements 70 and 80 are shown, it is to be understood that an embodiment of the system 60 may also include only one such processing element.

The system 60 is illustrated as a point-to-point interconnect system, wherein the first processing element 70 and the second processing element 80 are coupled via a point-to-point interconnect 71. It should be understood that any or all of the interconnects illustrated in FIG. 8 may be implemented as a multi-drop bus rather than point-to-point interconnect.

As shown in FIG. 8, each of the processing elements 70 and 80 may be multicore processors, including first and second processor cores (i.e., processor cores 74a and 74b and processor cores 84a and 84b). Such cores 74a, 74b, 84a, 84b may be configured to execute instruction code in a manner similar to that discussed above in connection with FIG. 7.

Each processing element 70, 80 may include at least one shared cache 99a, 99b. The shared cache 99a, 99b may store data (e.g., instructions) that are utilized by one or more components of the processor, such as the cores 74a, 74b and 84a, 84b, respectively. For example, the shared cache 99a, 99b may locally cache data stored in a memory 62, 63 for faster access by components of the processor. In one or more embodiments, the shared cache 99a, 99b may include one or more mid-level caches, such as level 2 (L2), level 3 (L3), level 4 (L4), or other levels of cache, a last level cache (LLC), and/or combinations thereof.

While shown with only two processing elements 70, 80, it is to be understood that the scope of the embodiments are not so limited. In other embodiments, one or more additional processing elements may be present in a given processor. Alternatively, one or more of the processing elements 70, 80 may be an element other than a processor, such as an accelerator or a field programmable gate array. For example, additional processing element(s) may include additional processors(s) that are the same as a first processor 70, additional processor(s) that are heterogeneous or asymmetric to processor a first processor 70, accelerators (such as, e.g., graphics accelerators or digital signal processing (DSP) units), field programmable gate arrays, or any other processing element. There can be a variety of differences between the processing elements 70, 80 in terms of a spectrum of metrics of merit including architectural, micro architectural, thermal, power consumption characteristics, and the like. These differences may effectively manifest themselves as asymmetry and heterogeneity amongst the processing elements 70, 80. For at least one embodiment, the various processing elements 70, 80 may reside in the same die package.

The first processing element 70 may further include memory controller logic (MC) 72 and point-to-point (P-P) interfaces 76 and 78. Similarly, the second processing element 80 may include a MC 82 and P-P interfaces 86 and 88. As shown in FIG. 8, MC's 72 and 82 couple the processors to respective memories, namely a memory 62 and a memory 63, which may be portions of main memory locally attached to the respective processors. While the MC 72 and 82 is illustrated as integrated into the processing elements 70, 80, for alternative embodiments the MC logic may be discrete logic outside the processing elements 70, 80 rather than integrated therein.

The first processing element 70 and the second processing element 80 may be coupled to an I/O subsystem 90 via P-P interconnects 76 and 86, respectively. As shown in FIG. 8, the I/O subsystem 90 includes P-P interfaces 94 and 98. Furthermore, the I/O subsystem 90 includes an interface 92 to couple I/O subsystem 90 with a high performance graphics engine 64. In one embodiment, a bus 73 may be used to couple the graphics engine 64 to the I/O subsystem 90. Alternately, a point-to-point interconnect may couple these components.

In turn, the I/O subsystem 90 may be coupled to a first bus 65 via an interface 96. In one embodiment, the first bus 65 may be a Peripheral Component Interconnect (PCI) bus, or a bus such as a PCI Express bus or another third generation I/O interconnect bus, although the scope of the embodiments are not so limited.

As shown in FIG. 8, various I/O devices 65a (e.g., biometric scanners, speakers, cameras, sensors) may be coupled to the first bus 65, along with a bus bridge 66 which may couple the first bus 65 to a second bus 67. In one embodiment, the second bus 67 may be a low pin count (LPC) bus. Various devices may be coupled to the second bus 67 including, for example, a keyboard/mouse 67a, communication device(s) 67b, and a data storage unit 68 such as a disk drive or other mass storage device which may include code 69, in one embodiment. The illustrated code 69 may implement one or more aspects of the processes described above, including processes for intelligent drive wear management as described herein with reference to process 105 (FIG. 1B) and/or process 400 (FIGS. 4A-4B). The illustrated code 69 may be similar to the code 42 (FIG. 7), already discussed. Further, an audio I/O 67c may be coupled to second bus 67 and a battery 61 may supply power to the computing system 60. The processing elements 70 and/or 80 may implement one or more aspects of the processor 12 as described herein with reference to FIG. 5.

Note that other embodiments are contemplated. For example, instead of the point-to-point architecture of FIG. 8, a system may implement a multi-drop bus or another such communication topology. Also, the elements of FIG. 8 may alternatively be partitioned using more or fewer integrated chips than shown in FIG. 8.

Embodiments of each of the above systems, devices, components and/or methods, including the system 100, the system 10, the semiconductor apparatus 30, the processor core 40, the system 60, process 105, process 400, and/or any other system components, may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof.

Alternatively, or additionally, all or portions of the foregoing systems and/or components and/or methods may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages.

Additional Notes and Examples

Example 1 includes a computing system comprising a processor, and a computer-readable storage medium coupled to the processor, the storage medium including instructions which, when executed by the processor, cause the computing system to determine a first difference between a wear value derived for each drive in a first pair of solid state storage drives, and swap content between the drives in the first pair of solid state storage drives if the first difference in wear value exceeds a wear skew threshold.

Example 2 includes the system of Example 1, further comprising an array of solid state storage drives, wherein the instructions, when executed, cause the computing system to sort the array of solid state storage drives into a plurality of drive groups based on a wear value derived for each drive, determine a second difference in wear value between drives in a second pair of solid state storage drives, wherein the first pair of drives and the second pair of drives are in the same drive group, and swap content between the drives in the second pair of solid state storage drives if the second difference in wear value exceeds the wear skew threshold.

Example 3 includes the system of Example 2, wherein each drive in a drive group has an associated rotation counter value, and wherein the instructions, when executed, cause the computing system to select respective pairs of drives in a drive group based on the drive wear value and the drive rotation counter value, and increment the rotation counter value for a drive each time contents of the drive are swapped based on a difference in wear value.

Example 4 includes the system of Example 3, wherein the instructions, when executed, further cause the computing system to determine an average rotation counter value for all drives in one of the drive groups, wherein to select respective pairs of drives in a drive group, the instructions, when executed, cause the computing system to select a first pair of the respective pairs of drives in the drive group from the drive having the highest wear value in a subset of drives in the drive group having a rotation counter value less than the average rotation counter value and the drive having the lowest wear value in the subset of drives in the drive group, and select a second pair of the respective pairs of drives in the drive group from the drive having the second highest wear value in the subset of drives in the drive group and the drive having the second lowest wear value in the subset of drives in the drive group.

Example 5 includes the system of Example 2, wherein the instructions, when executed, further cause the computing system to determine an average wear value for one of the drive groups based on the wear values of each drive in the drive group, and provide for maintenance service of the drives in the drive group if the average wear value for the drive group exceeds a potential drive failure threshold.

Example 6 includes the system of any of Examples 1-5, wherein the wear value for each drive is derived based on one or more of a size of the drive, a number of program or erase cycles for the drive, a total host or NAND bytes written to the drive, a write amplification factor for the drive, a total number of failed blocks for the drive, a number of remaining reserve blocks for the drive, a warranty end date for the drive, or a device temperature for the drive, wherein the wear skew threshold is set based on one or more of an expected frequency of drive rotation and a desired frequency of drive rotation, and wherein to swap content between the first drive and the second drive comprises one of swap all files between the first drive and the second drive or swap hot files between the first drive and the second drive.

Example 7 includes a semiconductor apparatus comprising one or more substrates, and logic coupled to the one or more substrates, wherein the logic is implemented at least partly in one or more of configurable logic or fixed-functionality hardware logic, the logic coupled to the one or more substrates to determine a first difference between a wear value derived for each drive in a first pair of solid state storage drives, and swap content between the drives in the first pair of solid state storage drives if the first difference in wear value exceeds a wear skew threshold.

Example 8 includes the apparatus of Example 7, wherein the logic is to sort an array of solid state storage drives into a plurality of drive groups based on a wear value derived for each drive, determine a second difference in wear value between drives in a second pair of solid state storage drives, wherein the first pair of drives and the second pair of drives are in the same drive group, and swap content between the drives in the second pair of solid state storage drives if the second difference in wear value exceeds the wear skew threshold.

Example 9 includes the apparatus of Example 8, wherein each drive in a drive group has an associated rotation counter value, and wherein the logic is to select respective pairs of drives in a drive group based on the drive wear value and the drive rotation counter value and increment the rotation counter value for a drive each time contents of the drive are swapped based on a difference in wear value.

Example 10 includes the apparatus of Example 9, wherein the logic is further to determine an average rotation counter value for all drives in one of the drive groups, wherein to select respective pairs of drives in a drive group, the logic is to select a first pair of the respective pairs of drives in the drive group from the drive having the highest wear value in a subset of drives in the drive group having a rotation counter value less than the average rotation counter value and the drive having the lowest wear value in the subset of drives in the drive group, and select a second pair of the respective pairs of drives in the drive group from the drive having the second highest wear value in the subset of drives in the drive group and the drive having the second lowest wear value in the subset of drives in the drive group.

Example 11 includes the apparatus of Example 8, wherein the logic is further to determine an average wear value for one of the drive groups based on the wear values of each drive in the drive group, and provide for maintenance service of the drives in the drive group if the average wear value for the drive group exceeds a potential drive failure threshold.

Example 12 includes the apparatus of any of Examples 7-11, wherein the wear value for each drive is derived based on one or more of a size of the drive, a number of program or erase cycles for the drive, a total host or NAND bytes written to the drive, a write amplification factor for the drive, a total number of failed blocks for the drive, a number of remaining reserve blocks for the drive, a warranty end date for the drive, or a device temperature for the drive, wherein the wear skew threshold is set based on one or more of an expected frequency of drive rotation and a desired frequency of drive rotation, and wherein to swap content between the first drive and the second drive comprises one of swap all files between the first drive and the second drive or swap hot files between the first drive and the second drive.

Example 13 includes the apparatus of Example 7, wherein the logic coupled to the one or more substrates includes transistor channel regions that are positioned within the one or more substrates.

Example 14 includes at least one non-transitory computer readable storage medium comprising a set of instructions for managing a runtime computing environment which, when executed by a computing system, cause the computing system to determine a first difference between a wear value derived for each drive in a first pair of solid state storage drives, and swap content between the drives in the first pair of solid state storage drives if the first difference in wear value exceeds a wear skew threshold.

Example 15 includes the at least one non-transitory computer readable storage medium of Example 14, wherein the instructions, when executed, cause the computing system to sort an array of solid state storage drives into a plurality of drive groups based on a wear value derived for each drive, determine a second difference in wear value between drives in a second pair of solid state storage drives, wherein the first pair of drives and the second pair of drives are in the same drive group, and swap content between the drives in the second pair of solid state storage drives if the second difference in wear value exceeds the wear skew threshold.

Example 16 includes the at least one non-transitory computer readable storage medium of Example 15, wherein each drive in a drive group has an associated rotation counter value, and wherein the instructions, when executed, cause the computing system to select respective pairs of drives in a drive group based on the drive wear value and the drive rotation counter value, and increment the rotation counter value for a drive each time contents of the drive are swapped based on a difference in wear value.

Example 17 includes the at least one non-transitory computer readable storage medium of Example 16, wherein the instructions, when executed, further cause the computing system to determine an average rotation counter value for all drives in one of the drive groups, wherein to select respective pairs of drives in a drive group, the instructions, when executed, cause the computing system to select a first pair of the respective pairs of drives in the drive group from the drive having the highest wear value in a subset of drives in the drive group having a rotation counter value less than the average rotation counter value and the drive having the lowest wear value in the subset of drives in the drive group, and select a second pair of the respective pairs of drives in the drive group from the drive having the second highest wear value in the subset of drives in the drive group and the drive having the second lowest wear value in the subset of drives in the drive group.

Example 18 includes the at least one non-transitory computer readable storage medium of Example 15, wherein the instructions, when executed, further cause the computing system to determine an average wear value for one of the drive groups based on the wear values of each drive in the drive group, and provide for maintenance service of the drives in the drive group if the average wear value for the drive group exceeds a potential drive failure threshold.

Example 19 includes the at least one non-transitory computer readable storage medium of any of Examples 14-18, wherein the wear value for each drive is derived based on one or more of a size of the drive, a number of program or erase cycles for the drive, a total host or NAND bytes written to the drive, a write amplification factor for the drive, a total number of failed blocks for the drive, a number of remaining reserve blocks for the drive, a warranty end date for the drive, or a device temperature for the drive wherein the wear skew threshold is set based on one or more of an expected frequency of drive rotation and a desired frequency of drive rotation, and wherein to swap content between the first drive and the second drive comprises one of swap all files between the first drive and the second drive or swap hot files between the first drive and the second drive.

Example 20 includes a method of drive wear management, comprising determining a first difference between a wear value derived for each drive in a first pair of solid state storage drives, and swapping content between the drives in the first pair of solid state storage drives if the first difference in wear value exceeds a wear skew threshold.

Example 21 includes the method of Example 20, further comprising sorting an array of solid state storage drives into a plurality of drive groups based on a wear value derived for each drive, determining a second difference in wear value between drives in a second pair of solid state storage drives, wherein the first pair of drives and the second pair of drives are in the same drive group, and swapping content between the drives in the second pair of solid state storage drives if the second difference in wear value exceeds the wear skew threshold.

Example 22 includes the method of Example 21, wherein each drive in a drive group has an associated rotation counter value, and further comprising selecting respective pairs of drives in a drive group based on the drive wear value and the drive rotation counter value, and incrementing the rotation counter value for a drive each time contents of the drive are swapped based on a difference in wear value.

Example 23 includes the method of Example 22, further comprising determining an average rotation counter value for all drives in one of the drive groups, wherein selecting respective pairs of drives in a drive group comprises selecting a first pair of the respective pairs of drives in the drive group from the drive having the highest wear value in a subset of drives in the drive group having a rotation counter value less than the average rotation counter value and the drive having the lowest wear value in the subset of drives in the drive group, and selecting a second pair of the respective pairs of drives in the drive group from the drive having the second highest wear value in the subset of drives in the drive group and the drive having the second lowest wear value in the subset of drives in the drive group.

Example 24 includes the method of Example 21, further comprising determining an average wear value for one of the drive groups based on the wear values of each drive in the drive group, and providing for maintenance service of the drives in the drive group if the average wear value for the drive group exceeds a potential drive failure threshold.

Example 25 includes the method of any of Examples 20-24, wherein the wear value for each drive is derived based on one or more of a size of the drive, a number of program or erase cycles for the drive, a total host or NAND bytes written to the drive, a write amplification factor for the drive, a total number of failed blocks for the drive, a number of remaining reserve blocks for the drive, a warranty end date for the drive, or a device temperature for the drive, wherein the wear skew threshold is set based on one or more of an expected frequency of drive rotation and a desired frequency of drive rotation, and wherein to swap content between the first drive and the second drive comprises one of swap all files between the first drive and the second drive or swap hot files between the first drive and the second drive.

Example 26 includes an apparatus comprising means for performing the method of any of Examples 20-24.

Thus, technology described herein improves the performance of computing systems through extending the lifetime of solid state drives within a comprehensive storage solution, as well as facilitate cost-effective serviceability and management of SSDs. For example, the drive wear management technology lowers operational costs by enabling longer time between first deployment and first servicing, longer time between intermediate servicing, and less servicing events during the lifetime of the solution. In addition, the technology enables the ability to use lower endurance drives in a tiered solution. The technology described herein may be applicable in any number of computing environments, including servers, cloud computing, and/or any environment providing computing services having a comprehensive storage requirement.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A, B, C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A computing system comprising:
    a processor; and
    a computer-readable storage medium coupled to the processor, the storage medium including instructions which, when executed by the processor, cause the computing system to:
        sort an array of solid state storage drives into a plurality of drive groups based on a wear value derived for each drive, wherein each drive in a drive group has an associated rotation counter value;
        determine an average rotation counter value for all drives in one of the drive groups;
        select respective pairs of drives in a drive group based on the drive wear value, the rotation counter value, and the average rotation counter value;
        determine a first difference between a wear value derived for each drive in a first pair of the respective pairs of drives in the drive group of solid state storage drives in a first storage subsystem; and
        swap content between the drives in the first pair of the respective pairs of drives in the drive group of solid state storage drives if the first difference in wear value exceeds a wear skew threshold.

2. The system of claim 1, wherein the instructions, when executed, cause the computing system to:
    determine a second difference in wear value between drives in a second pair of solid state storage drives, wherein the first pair of drives and the second pair of drives are in the same drive group; and
    swap content between the drives in the second pair of solid state storage drives if the second difference in wear value exceeds the wear skew threshold.

3. The system of claim 2, wherein the instructions, when executed, cause the computing system to:
    increment the rotation counter value for a drive each time contents of the drive are swapped based on a difference in wear value.

4. The system of claim 3,
    wherein to select respective pairs of drives in a drive group, the instructions, when executed, cause the computing system to:
        select a first pair of the respective pairs of drives in the drive group from the drive having the highest wear value in a subset of drives in the drive group having a rotation counter value less than the average rotation counter value and the drive having the lowest wear value in the subset of drives in the drive group; and
        select a second pair of the respective pairs of drives in the drive group from the drive having the second highest wear value in the subset of drives in the drive group and the drive having the second lowest wear value in the subset of drives in the drive group.

5. The system of claim 2, wherein the instructions, when executed, further cause the computing system to:
    determine an average wear value for one of the drive groups based on the wear values of each drive in the drive group; and
    provide for maintenance service of the drives in the drive group if the average wear value for the drive group exceeds a potential drive failure threshold.

6. The system of claim 2, wherein the wear value for each drive is derived based on one or more of a size of the drive, a number of program or erase cycles for the drive, a total host or NAND bytes written to the drive, a write amplification factor for the drive, a total number of failed blocks for the drive, a number of remaining reserve blocks for the drive, a warranty end date for the drive, or a device temperature for the drive;
    wherein the wear skew threshold is set based on one or more of an expected frequency of drive rotation and a desired frequency of drive rotation; and
    wherein to swap content between the first drive and the second drive comprises one of swap all files between the first drive and the second drive or swap hot files between the first drive and the second drive.

7. A semiconductor apparatus comprising:
    one or more substrates; and
    logic coupled to the one or more substrates, wherein the logic is implemented at least partly in one or more of configurable logic or fixed-functionality hardware logic, the logic coupled to the one or more substrates to:
        sort an array of solid state storage drives into a plurality of drive groups based on a wear value derived for each drive, wherein each drive in a drive group has an associated rotation counter value;
        determine an average rotation counter value for all drives in one of the drive groups;
        select respective pairs of drives in a drive group based on the drive wear value, the rotation counter value, and the average rotation counter value;
        determine a first difference between a wear value derived for each drive in a first pair of the respective pairs of drives in the drive group of solid state storage drives in a first storage subsystem; and
        swap content between the drives in the first pair of the respective pairs of drives in the drive group of solid state storage drives if the first difference in wear value exceeds a wear skew threshold.

8. The apparatus of claim 7, wherein the logic is to:
    determine a second difference in wear value between drives in a second pair of solid state storage drives, wherein the first pair of drives and the second pair of drives are in the same drive group; and swap content between the drives in the second pair of solid state storage drives if the second difference in wear value exceeds the wear skew threshold.

9. The apparatus of claim 8, and wherein the logic is to: increment the rotation counter value for a drive each time contents of the drive are swapped based on a difference in wear value.

10. The apparatus of claim 9, wherein to select respective pairs of drives in a drive group, the logic is to:
select a first pair of the respective pairs of drives in the drive group from the drive having the highest wear value in a subset of drives in the drive group having a rotation counter value less than the average rotation counter value and the drive having the lowest wear value in the subset of drives in the drive group; and
select a second pair of the respective pairs of drives in the drive group from the drive having the second highest wear value in the subset of drives in the drive group and the drive having the second lowest wear value in the subset of drives in the drive group.

11. The apparatus of claim 8, wherein the logic is further to:
determine an average wear value for one of the drive groups based on the wear values of each drive in the drive group; and
provide for maintenance service of the drives in the drive group if the average wear value for the drive group exceeds a potential drive failure threshold.

12. The apparatus of claim 8, wherein the wear value for each drive is derived based on one or more of a size of the drive, a number of program or erase cycles for the drive, a total host or NAND bytes written to the drive, a write amplification factor for the drive, a total number of failed blocks for the drive, a number of remaining reserve blocks for the drive, a warranty end date for the drive, or a device temperature for the drive;
wherein the wear skew threshold is set based on one or more of an expected frequency of drive rotation and a desired frequency of drive rotation; and
wherein to swap content between the first drive and the second drive comprises one of swap all files between the first drive and the second drive or swap hot files between the first drive and the second drive.

13. The apparatus of claim 7, wherein the logic coupled to the one or more substrates includes transistor channel regions that are positioned within the one or more substrates.

14. At least one non-transitory computer readable storage medium comprising a set of instructions for managing a runtime computing environment which, when executed by a computing system, cause the computing system to:
sort an array of solid state storage drives into a plurality of drive groups based on a wear value derived for each drive, wherein each drive in a drive group has an associated rotation counter value;
determine an average rotation counter value for all drives in one of the drive groups;
select respective pairs of drives in a drive group based on the drive wear value, the rotation counter value, and the average rotation counter value;
determine a first difference between a wear value derived for each drive in a first pair of the respective pairs of drives in the drive group of solid state storage drives in a first storage subsystem; and
swap content between the drives in the first pair of the respective pairs of drives in the drive group of solid state storage drives if the first difference in wear value exceeds a wear skew threshold.

15. The at least one non-transitory computer readable storage medium of claim 14, wherein the instructions, when executed, cause the computing system to:
determine a second difference in wear value between drives in a second pair of solid state storage drives, wherein the first pair of drives and the second pair of drives are in the same drive group; and
swap content between the drives in the second pair of solid state storage drives if the second difference in wear value exceeds the wear skew threshold.

16. The at least one non-transitory computer readable storage medium of claim 15, wherein the instructions, when executed, cause the computing system to:
increment the rotation counter value for a drive each time contents of the drive are swapped based on a difference in wear value.

17. The at least one non-transitory computer readable storage medium of claim 16, wherein to select respective pairs of drives in a drive group, the instructions, when executed, cause the computing system to:
select a first pair of the respective pairs of drives in the drive group from the drive having the highest wear value in a subset of drives in the drive group having a rotation counter value less than the average rotation counter value and the drive having the lowest wear value in the subset of drives in the drive group; and
select a second pair of the respective pairs of drives in the drive group from the drive having the second highest wear value in the subset of drives in the drive group and the drive having the second lowest wear value in the subset of drives in the drive group.

18. The at least one non-transitory computer readable storage medium of claim 15, wherein the instructions, when executed, further cause the computing system to:
determine an average wear value for one of the drive groups based on the wear values of each drive in the drive group; and
provide for maintenance service of the drives in the drive group if the average wear value for the drive group exceeds a potential drive failure threshold.

19. The at least one non-transitory computer readable storage medium of claim 15, wherein the wear value for each drive is derived based on one or more of a size of the drive, a number of program or erase cycles for the drive, a total host or NAND bytes written to the drive, a write amplification factor for the drive, a total number of failed blocks for the drive, a number of remaining reserve blocks for the drive, a warranty end date for the drive, or a device temperature for the drive;
wherein the wear skew threshold is set based on one or more of an expected frequency of drive rotation and a desired frequency of drive rotation; and
wherein to swap content between the first drive and the second drive comprises one of swap all files between the first drive and the second drive or swap hot files between the first drive and the second drive.

20. A method comprising:
sorting an array of solid state storage drives into a plurality of drive groups based on a wear value derived for each drive, wherein each drive in a drive group has an associated rotation counter value;
determining an average rotation counter value for all drives in one of the drive groups;

selecting respective pairs of drives in a drive group based on the drive wear value, the rotation counter value, and the average rotation counter value;

determining a first difference between a wear value derived for each drive in a first pair of the respective pairs of drives in the drive group of solid state storage drives in a first storage subsystem; and swapping content between the drives in the first pair of the respective pairs of drives in the drive group of solid state storage drives if the first difference in wear value exceeds a wear skew threshold.

21. The method of claim 20, further comprising:

determining a second difference in wear value between drives in a second pair of solid state storage drives, wherein the first pair of drives and the second pair of drives are in the same drive group; and swapping content between the drives in the second pair of solid state storage drives if the second difference in wear value exceeds the wear skew threshold.

22. The method of claim 21, further comprising:

incrementing the rotation counter value for a drive each time contents of the drive are swapped based on a difference in wear value.

23. The method of claim 22, wherein selecting respective pairs of drives in a drive group comprises:

selecting a first pair of the respective pairs of drives in the drive group from the drive having the highest wear value in a subset of drives in the drive group having a rotation counter value less than the average rotation counter value and the drive having the lowest wear value in the subset of drives in the drive group; and selecting a second pair of the respective pairs of drives in the drive group from the drive having the second highest wear value in the subset of drives in the drive group and the drive having the second lowest wear value in the subset of drives in the drive group.

24. The method of claim 21, further comprising:

determining an average wear value for one of the drive groups based on the wear values of each drive in the drive group; and providing for maintenance service of the drives in the drive group if the average wear value for the drive group exceeds a potential drive failure threshold.

25. The method of claim 21, wherein the wear value for each drive is derived based on one or more of a size of the drive, a number of program or erase cycles for the drive, a total host or NAND bytes written to the drive, a write amplification factor for the drive, a total number of failed blocks for the drive, a number of remaining reserve blocks for the drive, a warranty end date for the drive, or a device temperature for the drive;

wherein the wear skew threshold is set based on one or more of an expected frequency of drive rotation and a desired frequency of drive rotation; and wherein to swap content between the first drive and the second drive comprises one of swap all files between the first drive and the second drive or swap hot files between the first drive and the second drive.

* * * * *